US012733350B2

(12) United States Patent
Cho et al.

(10) Patent No.: US 12,733,350 B2
(45) Date of Patent: Sep. 8, 2026

(54) DISPLAY DEVICE

(71) Applicant: SAMSUNG DISPLAY CO., LTD., Yongin-si (KR)

(72) Inventors: Maeum Cho, Yongin-si (KR); Joonhyeong Kim, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 303 days.

(21) Appl. No.: 18/529,023

(22) Filed: Dec. 5, 2023

(65) Prior Publication Data

US 2024/0306432 A1 Sep. 12, 2024

(30) Foreign Application Priority Data

Mar. 7, 2023 (KR) ........................ 10-2023-0030006

(51) Int. Cl.
*H10K 59/122* (2023.01)
*H10K 59/40* (2023.01)
*H10K 59/80* (2023.01)

(52) U.S. Cl.
CPC ........... *H10K 59/122* (2023.02); *H10K 59/40* (2023.02); *H10K 59/8792* (2023.02)

(58) Field of Classification Search
CPC .. H10K 59/122; H10K 59/40; H10K 59/8792; H10K 59/38; H10K 59/121; H10K 59/35; H10K 59/8051; H10K 59/80; H10K 59/8052; G06F 3/0412; G06F 3/041; G06F 3/0443; G06F 3/044; G06F 3/0446
See application file for complete search history.

(56) References Cited

U.S. PATENT DOCUMENTS

| | | | | |
|---|---|---|---|---|
| 9,836,170 | B2 | 12/2017 | Kim et al. | |
| 11,569,321 | B2 | 1/2023 | Lee et al. | |
| 11,669,186 | B2 | 6/2023 | Kim et al. | |
| 2020/0235186 | A1 | 7/2020 | Jung et al. | |
| 2023/0010919 | A1 | 1/2023 | Oh et al. | |
| 2024/0196662 | A1* | 6/2024 | Hwang | H10K 59/121 |

FOREIGN PATENT DOCUMENTS

| | | |
|---|---|---|
| KR | 10-1407310 | 6/2014 |
| KR | 10-2186452 | 12/2020 |
| KR | 10-2303214 | 9/2021 |
| KR | 10-2022-0006689 | 1/2022 |
| KR | 10-2022-0113669 | 8/2022 |

* cited by examiner

*Primary Examiner* — Nikolay K Yushin
(74) *Attorney, Agent, or Firm* — F. CHAU & ASSOCIATES, LLC

(57) ABSTRACT

Disclosed is a display device including a display element layer, an input sensing layer, and an optical layer, and exhibiting excellent reliability. The display element layer may include first to third light-emitting elements spaced apart from each other in a direction perpendicular to a thickness direction of the display device and a pixel defining layer in which a pixel opening is defined. The input sensing layer may be arranged on the display element layer and include an organic layer, a conductive pattern layer, and an inorganic layer that are sequentially laminated. The optical layer may be arranged on the input sensing layer and include first to third filters respectively overlapping the first to third light-emitting elements. An opening that overlaps the pixel opening and does not overlap the conductive pattern layer may be defined in the inorganic layer.

21 Claims, 32 Drawing Sheets

NPXA
PXA-R
NPXA
PXA-G
NPXA
PXA-B
NPXA
IL_A2b
IL_A1
OC
BM
BM-OH
CF3
CF2
CF1
IS-ILb
IS-CL2
CL-OH
IL-OHb
CN
IS-CL1
IS-OL
IS-BS
ISP
W2b
W1
TFE
INF
OH
PDL
DP-ED
DP-CL
BS
DP
II
II'
EL1 HTR EML-R ETR EL2 CPL
ED-3
EL1 HTR EML-G ETR EL2 CPL
ED-2
EL1 HTR EML-B ETR EL2 CPL
ED-1
DR3
CF1
CF2
CF3
CIT
OC
BM
CIT
RCL
ED-1
ED-2
ED-3
ED
EML-R
EML-B
EML-G
EML

NPXA
PXA-B
PXA-G
PXA-R
OC
BM
BM-OH
TFE
INF
OH
PDL
DP-ED
DP-CL
BS
II'
II
CF1
CF2
CF3
EL1 HTR EML-B ETR EL2 CPL
ED-1
EL1 HTR EML-G ETR EL2 CPL
ED-2
EL1 HTR EML-R ETR EL2 CPL
ED-3
IS-ILc
IS-CL2
CL-OH
IL-OHc
CN
IS-CL1
IS-OL
IS-BS
ISP
DP
DR3
CF1 CF2 CF3 CIT
OC BM CIT RCL
ED-1 ED-2 ED-3 ED
EML-R EML-B EML-G EML

NPXA
PXA-R
NPXA
PXA-G
NPXA
PXA-B
NPXA
OC
BM
BM-OH
TFE
INF
OH
PDL
DP-ED
DP-CL
BS
II
II'
CF1
CF2
CF3
IS-ILd
IS-CL2
CL-OH
IL-OHd
CN
IS-CL1
IS-OL
IS-BS
ISP
DP
DR3
EL1 HTR EML-R ETR EL2 CPL
ED-3
EL1 HTR EML-G ETR EL2 CPL
ED-2
EL1 HTR EML-B ETR EL2 CPL
ED-1
CF1 CF2 CF3 } CIT
OC BM CIT } RCL
ED-1 ED-2 ED-3 } ED
EML-R EML-B EML-G } EML

CTL
BM
BM-OH
TFE
INF
OH
PDL
DP-ED
DP-CL
BS
NPXA
PXA-B
PXA-G
PXA-R
II
II'
IS-IL
IS-CL2
CL-OH
IL-OH
CN
IS-CL1
IS-OL
IS-BS
ISP
DP
DR3
EL1 HTR EML-B ETR EL2 CPL
ED-1
EL1 HTR EML-G ETR EL2 CPL
ED-2
EL1 HTR EML-R ETR EL2 CPL
ED-3
CTL
BM
RCLa
ED-1
ED-2
ED-3
ED
EML-R
EML-B
EML-G
EML

ISP
IS-PD
SL1
SL2
IS_NA
IS_A
E1-1
SP1
CP1
E1-2
E1-3
E1-4
E1-5
E2-4
E2-3
SP2
CP2
CH-I
E2-2
E2-1
DR1
DR2
DR3

FIG. 16

MSK
M2
M1
M2
R2
R1
R2
TFE
INF
OH
PDL
DP-ED
DP-CL
BS
II'
II
P-PT
P-CL1
IS-BS
DP
DR3
EL1 HTR EML-B ETR EL2 CPL
ED-1
EL1 HTR EML-G ETR EL2 CPL
ED-2
EL1 HTR EML-R ETR EL2 CPL
ED-3

TFE
INF
OH
PDL
DP-ED
DP-CL
BS
II'
II
IS-CL1
P-OL
IS-BS
DP
DR3
EL2 CPL
ETR EL2
EML-B ETR
HTR EML-B
EL1 HTR
ED-1
EML-G ETR
HTR EML-G
ED-2
EML-R ETR
HTR EML-R
ED-3

DP-ED
TFE
INF
OH
PDL
DP-CL
BS
II'
CPL
EL2
ETR
EML-B
HTR
EL1
ED-1
EML-G
ED-2
EML-R
ED-3
II
IS-IL
IS-CL2
IL-OH
CN
IS-CL1
IS-OL
IS-BS
DP
DR3

FIG. 29

DISPLAY DEVICE

CROSS-REFERENCE TO RELATED APPLICATIONS

This U.S. non-provisional patent application claims priority under 35 U.S.C. § 119 to Korean Patent Application No. 10-2023-0030006, filed on Mar. 7, 2023, in the Korean Intellectual Property Office, the entire contents of which are herein incorporated by reference.

TECHNICAL FIELD

The present inventive concept relates to a display device including an input sensing layer.

DISCUSSION OF RELATED ART

Various display devices for use in multimedia devices such as, for example, televisions, mobile phones, tablet computers, navigation devices, game machines, and the like are being developed. These display devices may include an input sensing member as an input device.

The input sensing member may include a sensing electrode for sensing an input, and an organic layer and an inorganic layer for insulating the sensing electrode. The organic layer including an organic material generates gas or the like due to outgassing, and the generated gas without being discharged causes damage to components of a display device and leads to degrading reliability of the display device.

SUMMARY

The present inventive concept provides a display device that facilitates discharge of gas generated due to outgassing of an organic layer.

An embodiment of the present inventive concept provides a display device including: a display element layer including first to third light-emitting elements spaced apart from each other in a direction perpendicular to a thickness direction of the display device and a pixel defining layer in which a pixel opening is defined; an input sensing layer arranged on the display element layer and including an organic layer, a conductive pattern layer, and an inorganic layer that are sequentially laminated; and an optical layer arranged on the input sensing layer and including first to third filters respectively overlapping the first to third light-emitting elements, in which an opening that overlaps the pixel opening and does not overlap the conductive pattern layer is defined in the inorganic layer.

In an embodiment of the present inventive concept, the inorganic layer may cover the conductive pattern layer.

in an embodiment of the present inventive concept, a width of the opening defined in the inorganic layer may be equal to or smaller than a width of the pixel opening in the direction perpendicular to the thickness direction.

In an embodiment of the present inventive concept, at least one of the first to third filters may contact the organic layer through the opening defined in the inorganic layer.

In an embodiment of the present inventive concept, the first to third filters each may include a pigment or a dye, which may fill the opening defined in the inorganic layer.

In an embodiment of the present inventive concept, the first to third light-emitting elements each may include a first electrode, a second electrode arranged on the first electrode, and an emission layer arranged between the first electrode and the second electrode, and the opening defined in the inorganic layer may overlap at least one of the emission layer of the first light-emitting element, the emission layer of the second light-emitting element, or the emission layer of the third light-emitting element.

In an embodiment of the present inventive concept, the emission layer of the first light-emitting element may emit first light, the emission layer of the second light-emitting element may emit second light different from the first light, and the emission layer of the third light-emitting element may emit third light different from the first light and the second light.

In an embodiment of the present inventive concept, the opening defined in the inorganic layer may have a quadrilateral shape or a circular shape in a plan view.

In an embodiment of the present inventive concept, the optical layer may further include a pattern part in which a pattern opening is defined, and the first to third filters may fill the pattern opening.

In an embodiment of the present inventive concept, the opening defined in the inorganic layer may overlap the pattern opening.

In an embodiment of the present inventive concept, the input sensing layer may further include a signal line connected to the conductive pattern layer and a pad electrode connected to an end of the signal line, and the inorganic layer may not overlap the pad electrode.

In an embodiment of the present inventive concept, the conductive pattern layer may include a conductive line overlapping the pixel defining layer, the conductive line may include a first face parallel with a top surface of the organic layer and a second face inclined with respect to the first face in a cross-sectional view, and the inorganic layer may cover the first face and the second face of the conductive line.

In an embodiment of the present inventive concept, the inorganic layer may be divided into a first region overlapping the pixel defining layer and a second region not overlapping the pixel defining layer.

In an embodiment of the present inventive concept, the second region may extend from the first region, and the opening defined in the inorganic layer may be spaced apart from the first region with the second region therebetween.

In an embodiment of the present inventive concept, the second region may be spaced apart from the first region with the opening defined in the inorganic layer interposed therebetween.

In an embodiment of the present inventive concept, a display device includes: a display element layer including a light-emitting element and a pixel defining layer in which a pixel opening is defined; an input sensing layer including an organic layer, a conductive pattern layer, and an inorganic layer that are sequentially laminated on the display element layer; and an optical layer including a pigment or a dye and entirely overlapping the display element layer, in which an opening that overlaps the pixel opening and does not overlap the conductive pattern layer is defined in the inorganic layer.

In an embodiment of the present inventive concept, the pigment or the dye may fill the opening defined in the inorganic layer.

In an embodiment of the present inventive concept, the optical layer may further include a pattern part in which a pattern opening is defined, with the pattern part overlapping the pixel defining layer, and the pigment or the dye may fill the pattern opening.

In an embodiment of the present inventive concept, the opening defined in the inorganic layer may overlap the pattern opening.

In an embodiment of the present inventive concept, light-emitting element may include a first electrode exposed in the pixel opening, a second electrode arranged on the first electrode, and an emission layer arranged between the first electrode and the second electrode, and the opening defined in the inorganic layer may overlap the emission layer.

In an embodiment of the present inventive concept, a display device includes: a display element layer including first to third light-emitting elements divided by a pixel defining layer and spaced apart from each other in a direction perpendicular to a thickness direction of the display device, the first to third light-emitting elements including first to third emission layers, respectively; an input sensing layer arranged on the display element layer and including an organic layer, a conductive pattern layer, and an inorganic layer that are sequentially laminated; and an optical layer arranged on the input sensing layer and including first to third filters respectively overlapping the first to third light-emitting elements, in which one or more openings that respectively overlap at least one of the first to third emission layers and do not overlap the conductive pattern layer are defined in the inorganic layer.

BRIEF DESCRIPTION OF THE DRAWINGS

The accompanying drawings are included to provide a further understanding of the present inventive concept. The drawings illustrate embodiments of the present inventive concept and, together with the description thereof, serve to explain principles of the present inventive concept, in which:

Figure 16:
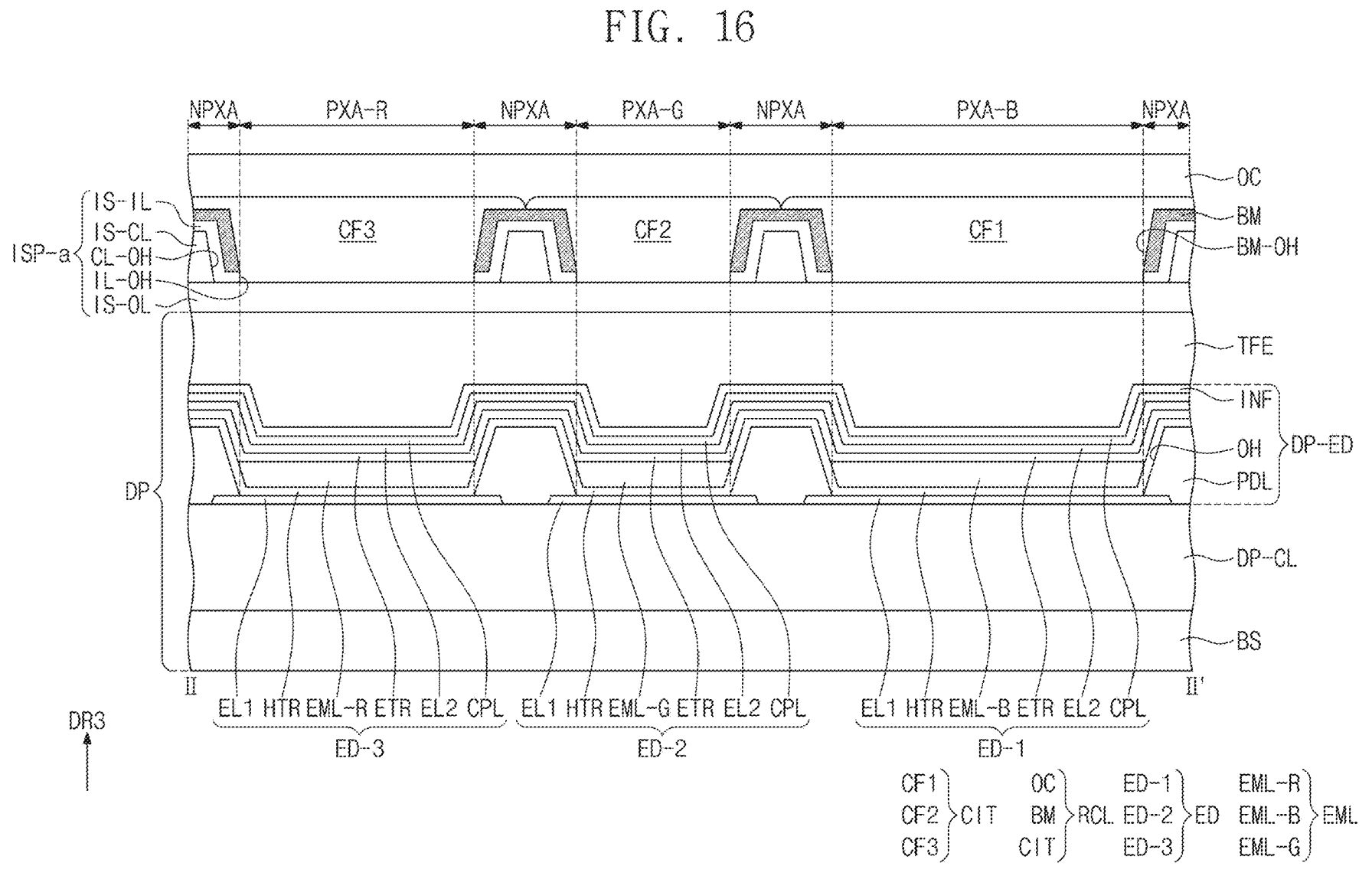

FIG. 16 is a cross-sectional view illustrating a portion of a display device according to an embodiment of the present inventive concept;

FIG. 29 is a diagram schematically illustrating a process of manufacturing a display device according to an embodiment of the present inventive concept.

Figure 1:
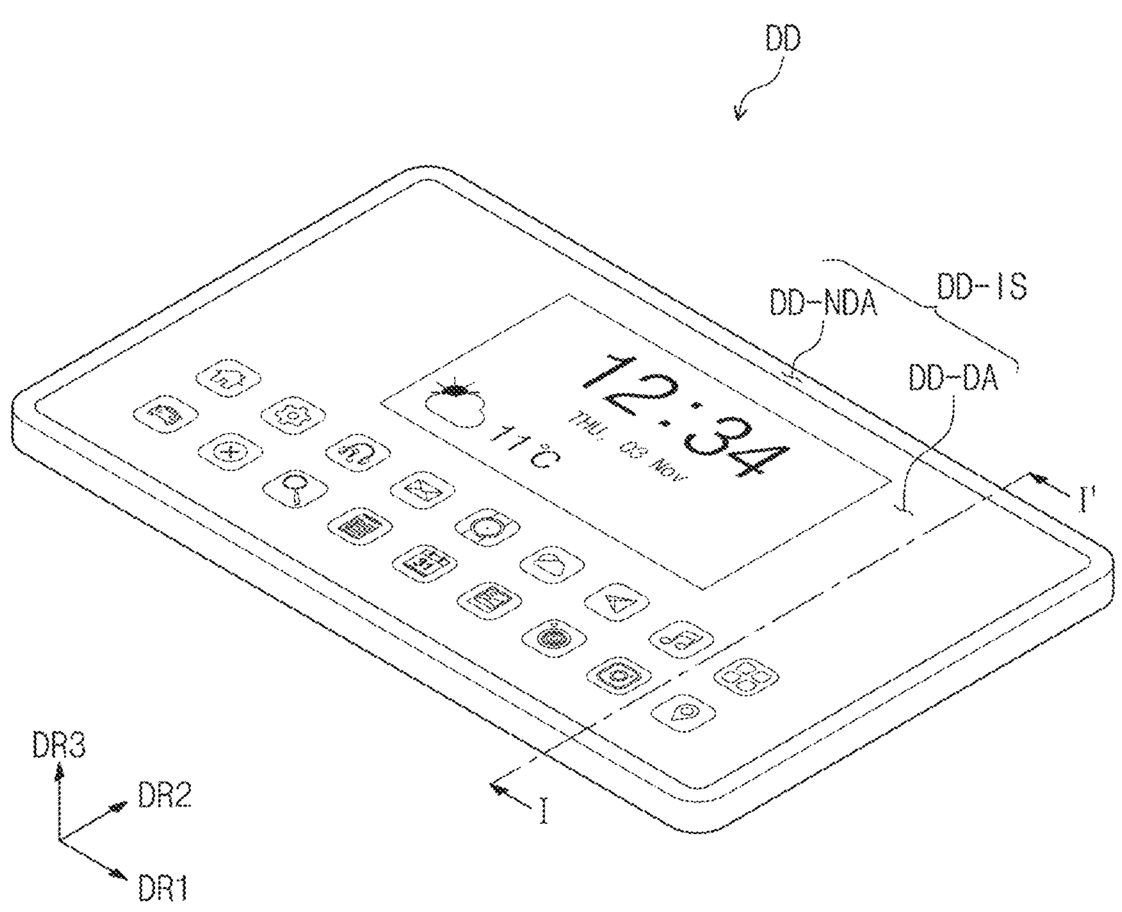
FIG. 1 is a perspective view illustrating a display device of an embodiment of the present inventive concept.

Since the drawings in FIGS. 1-29 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Embodiments of the present inventive concept may be variously modified and may include various modes. However, particular embodiments are illustrated in the drawings and are described in detail below. However, it should be understood that the present inventive concept is not limited to specific forms, but rather cover all modifications, equivalents or alternatives that fall within the spirit and scope of the present inventive concept.

It will be understood that when an element (or a region, layer, portion, or the like) is referred to as being "on", "connected to", or "coupled to" another element, it can be directly on, directly connected to, or directly coupled to the other element, or a third element may be present therebetween.

The same reference numerals refer to the same elements. As used herein, the term "and/or" includes any combinations that can be defined by associated elements.

The terms "first", "second" and the like may be used for describing various elements, but the elements should not be construed as being limited by the terms. Such terms are only used for distinguishing one element from other elements. For example, a first element could be termed a second element and vice versa without departing from the scope and spirit of the present inventive concept. The terms of a singular form may include plural forms unless otherwise specified.

Furthermore, the terms "under", "lower side", "on", "upper side", and the like are used to describe association relationships among elements illustrated in the drawings. The terms, which are relative concepts, are used on the basis of directions illustrated in the drawings, and it will be understood that these spatially relative terms are intended to encompass different orientations of the device in use or operation, in addition to the orientation illustrated in the drawings.

It will be further understood that the terms "comprise", "comprising", "include", "including", "have", "having", and the like, when used in this specification, specify the presence of stated features, numbers, steps, operations, elements, components, or combinations thereof, but do not preclude the presence or addition of one or more other features, numbers, steps, operations, elements, components, or combinations thereof.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

All of the terms used herein (including technical and scientific terms) have the same meanings as understood by those skilled in the art, unless otherwise defined. Terms in common usage such as those defined in commonly used dictionaries should be interpreted to contextually match the lexical meanings in the relevant art, and should not be interpreted in an idealized or overly formal sense unless otherwise defined explicitly.

Hereinafter, a display device according to an embodiment of the present inventive concept will be described with reference to the accompanying drawings. FIG. 1 is a perspective view illustrating a display device of an embodiment of the present inventive concept.

Referring to FIG. 1, a display device DD of an embodiment of the present inventive concept may be a device activated in response to an electric signal. For example, the display device DD may include a large-size device such as, for example, a television, a monitor, an outdoor advertising board, or a vehicle navigation device. Furthermore, the display device DD may include a small-size device such as a personal computer, a laptop computer, a tablet PC, a personal digital assistant, a game machine, a smartphone, a smart watch, or a camera. These devices listed above are merely examples, and thus the display device DD may also be adopted as other electronic devices without departing from the present inventive concept.

The display device DD may display an image IM (or video) through a display surface DD-IS. The display surface DD-IS may be parallel with a plane defined by a first direction DR1 and a second direction DR2 intersecting the first direction DR1. Although FIG. 1 illustrates the display device DD having the planar display surface DD-IS, the present inventive concept is not limited thereto. The display device DD may include a curved display surface or a three-dimensional display surface. The three-dimensional display surface may include a plurality of display regions indicating different directions. The display device DD is in the shape of a rectangle having a long edge (or side) in the first direction DR1 and a short edge (or side) in the second direction DR2. A corner where the short side in second direction DR2 and the long side in the first direction DR1 meet may be formed to have a round shape with a predetermined curvature or have a right-angled shape. However, the shape of the display device DD is not limited thereto. For example, the display device DD may be implemented in various shapes such as, for example, a circular shape, an oval shape, an atypical shape, or another polygonal shape such as, for example, a triangle, a pentagon or a hexagon.

The display surface DD-IS may include a display region DD-DA and a non-display region DD-NDA. The display device DD may display the image IM through the display region DD-DA. The image IM includes not only a moving image, but also a still image. The non-display region DD-NDA may be adjacent to the display region DD-DA. The non-display region DD-NDA may be an area where the image IM is not displayed. The non-display region DD-NDA may surround the display region DD-DA. However, FIG. 1 merely illustrates an example, and the non-display region DD-NDA may be arranged adjacent to only one side of the display region DD-DA, or may not be provided.

Although FIG. 1 and the following figures illustrate first to third direction axes DR1 to DR3, the directions indicated by the first to third direction axes DR1 to DR3 described herein are relative, and thus may be changed to other directions. Furthermore, the directions indicated by the first to third direction axes DR1 to DR3 may be referred to as first to third directions, and the same reference signs may be used. Herein, the first direction axis DR1 and the second direction axis DR2 may be perpendicular to each other, and the third direction axis DR3 may be a normal direction to the plane defined by the first direction axis DR1 and the second direction axis DR2. As used herein, "a plan view" may mean a view in the third direction DR3.

A thickness direction of the display device DD may be parallel with the third direction axis DR3. Upper sides (or upper surfaces) and lower sides (or lower surfaces) may be defined based on the third direction axis DR3. The upper sides (or upper surfaces) represent a direction (or face) towards the display surface DD-IS, and the lower sides (lower surfaces) represent a direction (or face) away from the display surface DD-IS. Cross-sections represent a face parallel with the thickness direction DR3, and planes represent a face perpendicular to the thickness direction DR3. For example, the display device DD may display the image IM towards the third direction DR3. The planes represent a plane defined by the first direction axis DR1 and the second direction axis DR2.

Figure 2:
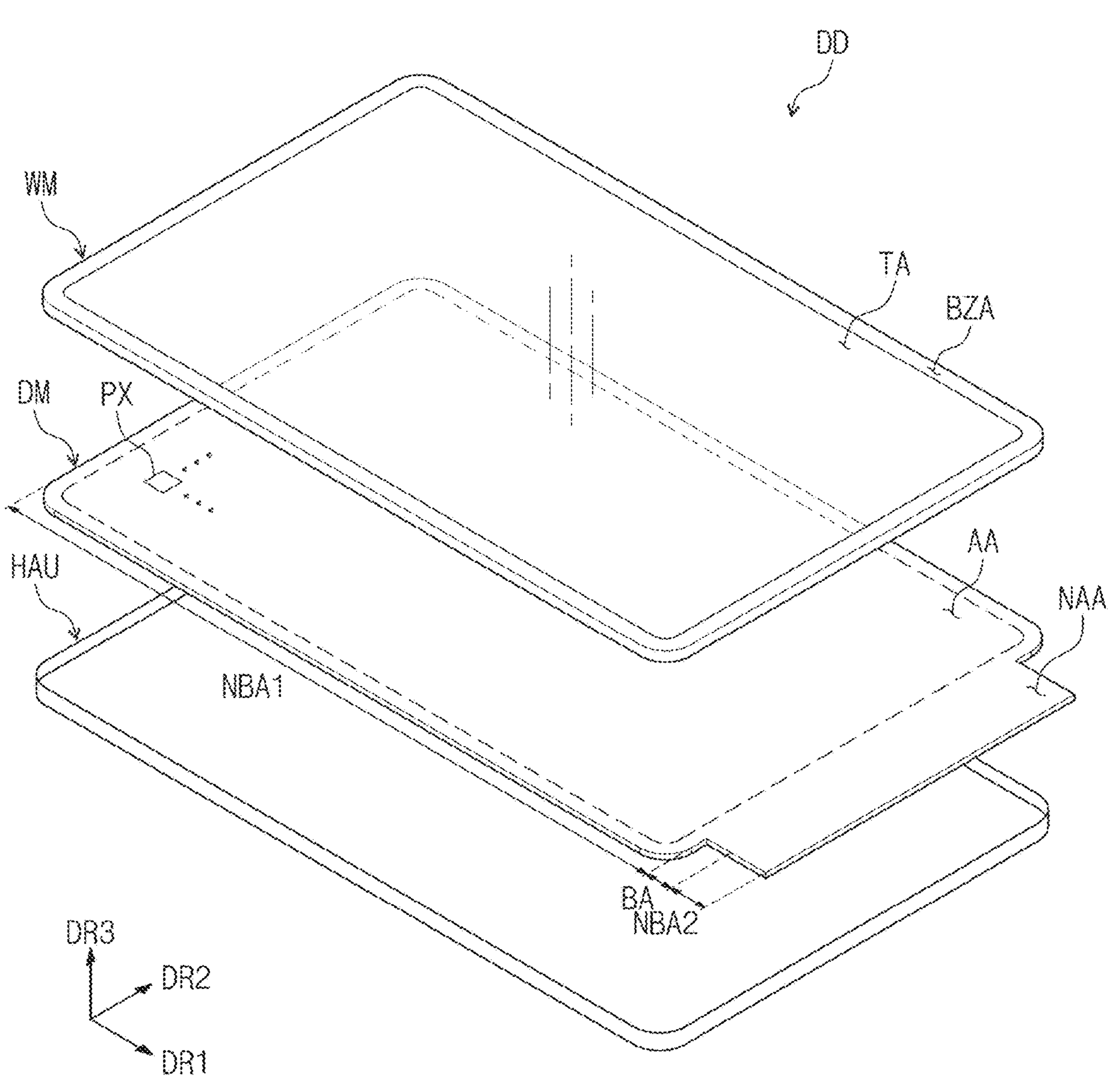
FIG. 2 is an exploded perspective view illustrating a display device of an embodiment of the present inventive concept.

FIG. 2 is an exploded perspective view of the display device DD of an embodiment of the present inventive concept. The display device DD may include a display module DM and a window member WM arranged on the display module DM. The display device DD may further include a housing HAU. The window member WM and the housing HAU are combined to each other to form an appearance of the display device DD.

The window member WM may cover an entire outer side of the display module DM. The window member WM may include a transmissive region TA and a bezel region BZA. A front surface of the window member WM, including the transmissive region TA and the bezel region BZA, may correspond to a front surface of the display device DD. The transmissive region TA may correspond to the display region DD-DA of the display device DD illustrated in FIG. 1, and the bezel region BZA may correspond to the non-display region DD-NDA of the display device DD illustrated in FIG. 1.

The transmissive region TA may be an optically clear region. For example, the transmission region TA may exhibit a light transmittance of about 90% or greater in a visible light area. The bezel region BZA may have a relatively low light transmittance compared to the transmissive region TA, and may include an opaque material that blocks a light. The bezel region BZA may have a predetermined color. The bezel region BZA may be adjacent to and surround the transmissive region TA. The bezel region BZA may define a shape of the transmissive region TA. However, the present inventive concept is not limited thereto, and the bezel region BZA may be arranged adjacent to only one side of the transmissive region TA or may be partially omitted. According to an embodiment of the present inventive concept, the bezel region BZA may be defined by a printed layer formed on a transparent substrate. For example, when the window member WM is provided as a glass or plastic substrate, the bezel region BZA may be a color layer printed or deposited on one side of a glass or plastic substrate. For example, the bezel region BZA may be formed by coloring the corresponding area of the glass or plastic substrate.

The display module DM may be a component that generates an image and senses an externally applied input. In the display module DM, an active region AA and a peripheral region NAA may be defined. The active region AA may correspond to the display region DD-DA illustrated in FIG. 1, and the peripheral region NAA may correspond to the non-display region DD-NDA illustrated in FIG. 1.

The active region AA may be a region which is activated in response to an electric signal. The active region AA may be defined as an area through which an image IM provided from the display module DM is output. Also, the active region AA may be defined as an area in which an input sensor senses an external input applied from outside. The peripheral region NAA may be a region arranged adjacent to at least one side of the active region AA. The peripheral region NAA may be arranged surrounding the active region AA. However, the present inventive concept is not limited thereto, and the peripheral region NAA may be partially omitted unlike the illustration. A driving circuit or driving wiring for driving the active region AA may be arranged in the peripheral region NAA.

A plurality of pixels PX may be arranged in the active region AA. The plurality of pixels PX may include a red pixel, a green pixel, and a blue pixel, and may further include a white pixel according to an embodiment of the present inventive concept. The pixels PX may be arranged in the first direction DR1 and the second direction DR2. The pixels PX may include a plurality of pixel rows extending in the first direction DR1 and arranged in the second direction DR2, and a plurality of pixel columns extending in the second direction DR2 and arranged in the first direction DR1. In an embodiment of the present inventive concept, the plurality of pixels PX may be arranged in a matrix structure or a pentile matrix structure, but the present inventive concept is not limited thereto. For example, the plurality of pixels PX may be arranged in a stripe structure, a mosaic structure, or a delta structure.

The display module DM may be bent and accommodated in the housing HAU. The display module DM may be divided into a bending region BA and first and second non-bending regions NBA1 and NBA2 spaced apart from each other with the bending region BA therebetween. The first non-bending region NBA1, the bending region BA, and the second non-bending region NBA2 may be sequentially arranged in the first direction DR1. In an embodiment of the present inventive concept, the second non-bending region NBA2 may be located in the peripheral region NAA. In a plan view, an area size of the first non-bending region NBA1 may be larger than an area size of the bending region BA and an area size of the second non-bending region NBA2. In a state in which the bending region BA is bent, at least a portion of the second non-bending region NBA2 may overlap the first non-bending region NBA1.

The housing HAU may include a material having a relatively high rigidity. For example, the housing HAU may include a plurality of frames and/or plates composed of glass, plastic, or metal. The housing HAU may provide a predetermined accommodation space. The display module DM may be accommodated in the accommodation space so as to be provided from an external impact. For example, the housing HAU may be coupled to the window member WM to provide a predetermined inner space. The display module DM may be accommodated in the inner space. In other words, the window member WM may couple with the housing HAU to fix in place the display module DM. In addition to the display module DM, components required to drive the display device DD, for example, a power supply unit, such as, for example, a battery, a circuit board, or the like, may be mounted inside the housing HAU. Also, according to an embodiment of the present inventive concept, a sensor, such as a proximity sensor and/or an illumination sensor, may be mounted inside the housing HAU.

Figure 3:
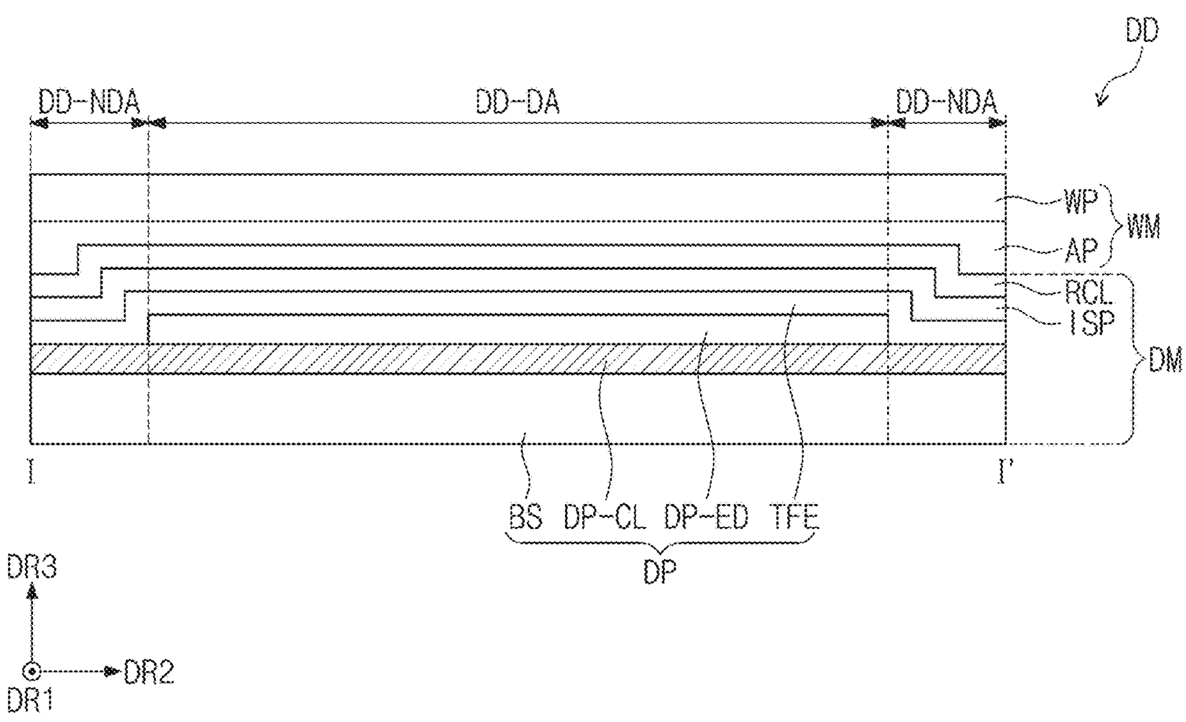
FIG. 3 is a cross-sectional view taken along line I-I' of FIG. 1.

FIG. 3 is a cross-sectional view taken along line I-I' of FIG. 1. FIG. 3 may be a cross-sectional view illustrating the display device DD. Referring to FIG. 3, the display module DM may include a display panel DP, an input sensing layer ISP arranged on the display panel DP, and an optical layer RCL arranged on the input sensing layer ISP.

The display panel DP may substantially generate an image. The display panel DP may be an emissive display panel, for example, may be an organic light-emitting display panel, an inorganic light-emitting display panel, a quantum dot display panel, a micro LED display panel, or a nano LED display panel. The panels are distinguished depending on constituent materials of light-emitting elements. A light-emitting layer of the quantum dot display panel may include quantum dots, quantum rods, and/or the like. The inorganic light-emitting display panel may include an inorganic light-emitting material, which may include crystalline semiconductors such as, for example, gallium nitride (GaN), indium phosphide (InP), etc. The display panel DP may be referred to as a display layer. The display panel DP may include a base layer BS, a circuit layer DP-CL, a display element layer DP-ED, and an encapsulation layer TFE laminated sequentially.

The base layer BS may be a member that provides a base surface on which the circuit layer DP-CL is arranged. The base layer BS may be a rigid substrate or a flexible substrate that is bendable, foldable, or rollable. The base layer BS may be, for example, a glass substrate, a metal substrate, a polymer substrate, or the like. However, the present inventive concept is not limited thereto, and, thus, the base layer BS may be an inorganic layer, an organic layer, or a composite material layer. Components disposed on the base layer BL overlap with the display region DD-DA or the non-display region DD-NDA.

The circuit layer DP-CL may be arranged on the base layer BS. The circuit layer DP-CL may include an insulating layer, a semiconductor pattern, a conductive pattern, a signal line, and the like. An insulating layer, a semiconductor layer, and a conductive layer may be formed on the base layer BS through coating, deposition, or the like, and thereafter, the insulating layer, the semiconductor layer, and the conductive layer may be selectively patterned by repeating a photolithography process multiple times. Thereafter, the semiconductor pattern, conductive pattern, and signal line included in the circuit layer DP-CL may be formed. The circuit layer DP-CL may include driving circuits of the pixels PX. The driving circuits of the pixels PX may include transistors and capacitors.

Figure 5:
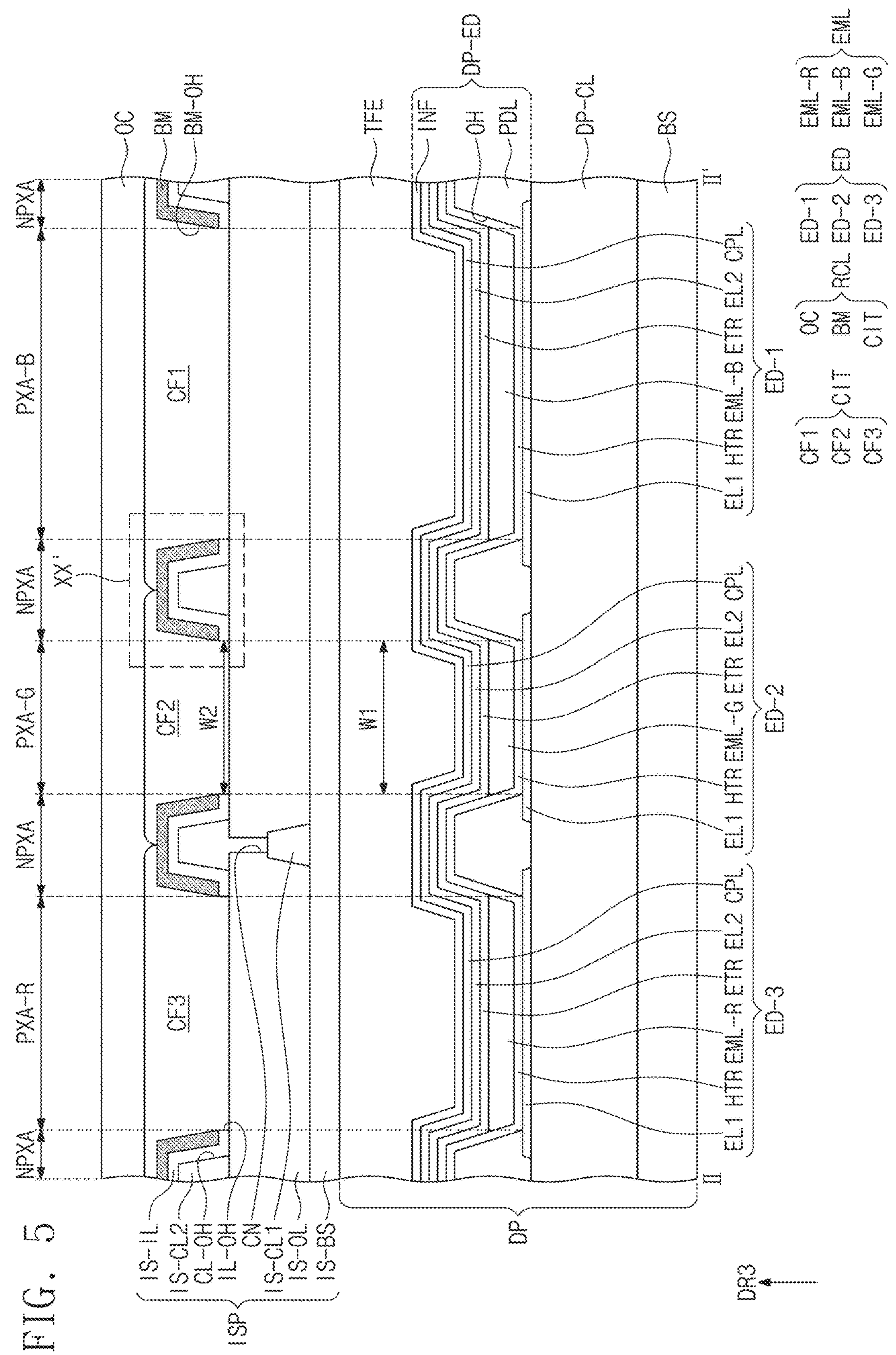
FIG. 5 is a cross-sectional view taken along line II-II' of FIG. 4.

The display element layer DP-ED may be arranged on the circuit layer DP-CL. The display element layer DP-ED may include a light-emitting element ED (FIG. 5). For example, the display element layer DP-ED may include, for example, organic light-emitting material, inorganic light-emitting material, organic-inorganic light-emitting material, quantum dot, quantum rod, micro LED, or nano LED.

The encapsulation layer TFE may be arranged on the display element layer DP-ED. The encapsulation layer TFE may seal the display element layer DP-ED. For example, the encapsulation layer TFE may protect the display element layer DP-ED from moisture, oxygen, and foreign matter such as dust particles.

The input sensing layer ISP may be arranged on the display panel DP. The input sensing layer ISP may sense and convert an external input into a predetermined input signal, and provide the input signal to the display panel DP. For example, in the display device DD of an embodiment of the present inventive concept, the input sensing layer ISP may be a touch sensing unit for sensing a touch. The input sensing layer ISP may recognize a direct touch or indirect touch of a user and a direct touch or indirect touch of an object.

The input sensing layer ISP may sense at least one of a position or strength (pressure) of an externally input touch. The display panel DP may receive an input signal from the input sensing layer ISP, and generate an image corresponding to the input signal. For example, the input sensing layer ISP may sense an external input in a capacitive manner. For example, the input sensing layer ISP may obtain coordinate information in a mutual capacitance scheme or a self-capacitance scheme. However, this is merely an example, and a driving method of the input sensing layer ISP is not limited to a certain embodiment. In an embodiment of the present inventive concept, the input sensing layer ISP may sense an external input using an electromagnetic induction scheme or a pressure sensing scheme.

The input sensing layer ISP may be formed on the display panel DP through a continuous process. In this case, the input sensing layer ISP may be directly arranged on the display panel DP. That is, an additional adhesive member may not be arranged between the input sensing layer ISP and the display panel DP. Alternatively, the input sensing layer ISP may be coupled to the display panel DP through an adhesive member. The adhesive member may include a typical adhesive or removable adhesive. That is, the input sensing layer ISP may be manufactured through a process separate from that of the display panel DP and may then be fixed on an upper surface of the display panel DP by an adhesive film.

In the present inventive concept, the wording "component is directly arranged on another component" represents that a third component is not arranged between the component and the other component. That is, when a component is referred to as being "directly arranged" on another component, the component "contacts" the other component.

The optical layer RCL may include a pigment or dye. The optical layer RCL may be a layer that selectively transmits light emitted from the display panel DP. The optical layer RCL may be a layer that reduces reflectance of externally incident light.

The window member WM may be arranged on the display module DM. The window member WM may include a window WP and an adhesive layer AP. The window member WM may further include at least one functional layer provided on the window WP. For example, the functional layer may be a hard coating layer, anti-fingerprint coating layer, an anti-reflective layer, or the like, but the present inventive concept is not limited thereto. The anti-reflective layer decreases reflectivity of an external light incident from above the window WP, and may reduce reflectance of a light (external light) incident from the outside towards the display device DD, and enhance color purity of a light emitted from the display device DD. The anti-reflective layer according to an embodiment of the present inventive concept may include a retarder and a polarizer.

The window WP may include an optically clear insulating material capable of outputting the image IM. The window WP may be, for example, a glass substrate or a polymer substrate. For example, the window WP may be a strengthened glass substrate. Alternatively, the window WP may be made of, for example, polyimide, polyacrylate, polymethylmethacrylate, polycarbonate, polyethylenenaphthalate, polyvinylidene chloride, polyvinylidene difluoride, polystyrene, ethylene vinylalcohol copolymer, or combinations thereof. However, this is merely illustrative, and a material of the window WP is not limited thereto.

The window WP may be coupled to the display module DM by the adhesive layer AP. The adhesive layer AP may include a typical adhesive such as, for example, a pressure sensitive adhesive (PSA), optically clear adhesive (OCA), an optically clear resin (OCR), or the like, but is not limited to a certain embodiment. Unlike the illustration, the adhesive layer AP may not be provided.

Figure 4:
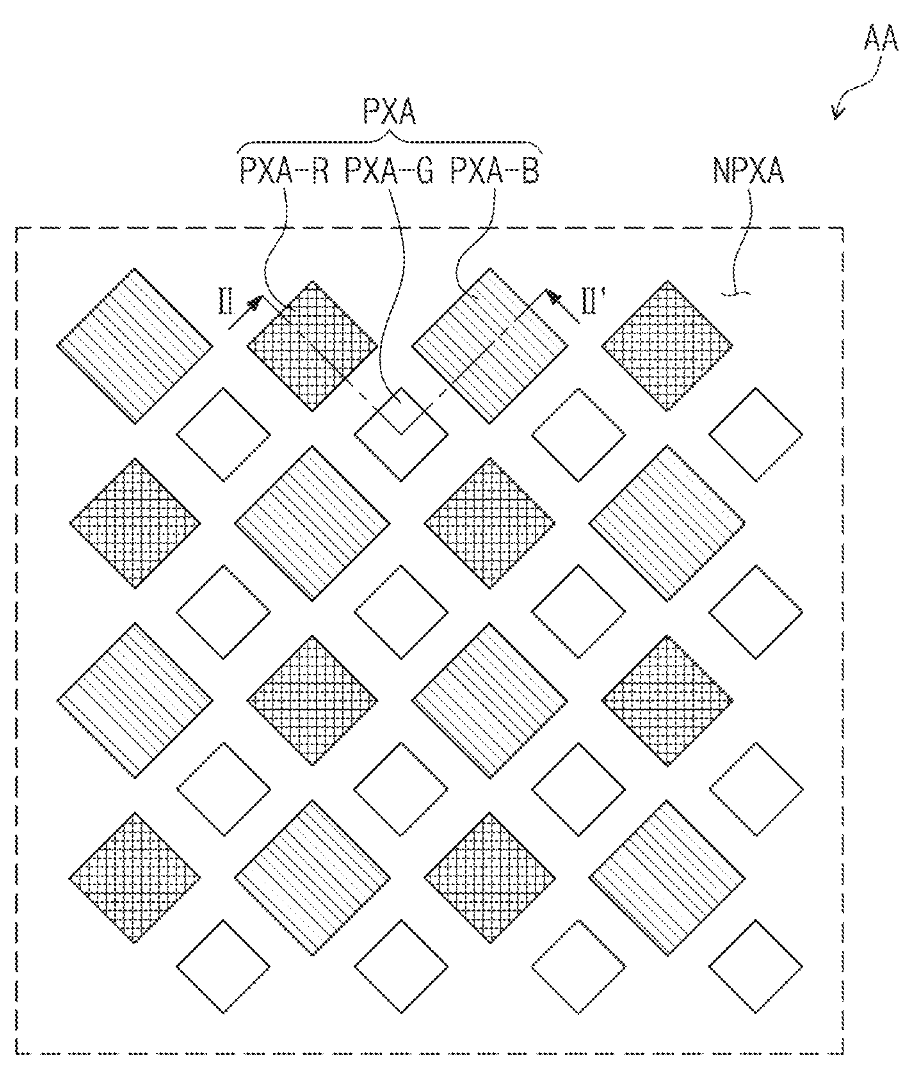
FIG. 4 is a plan view of a portion of a display device according to an embodiment of the present inventive concept.
Figure 4:
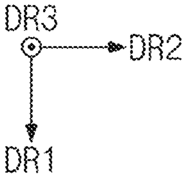

FIG. 4 is an enlarged plan view of the active region AA. The active region AA may be divided into a light-emitting region PXA and a non-light-emitting region NPXA. The non-light-emitting region NPXA may surround the light-emitting region PXA.

The light-emitting region PXA may be provided as a plurality of light-emitting regions emitting light of different wavelength regions. The light-emitting region PXA may include a blue light-emitting region PXA-B, a green light-emitting region PXA-G, and a red light-emitting region PXA-R. However, the present inventive concept is not limited thereto, and the light-emitting regions PXA-R, PXA-G, and PXA-B may emit light other than red light, green light, and blue light.

In the light-emitting region PXA, the blue light-emitting region PXA-B may have a largest area size, and the green light-emitting region PXA-G may have a smallest area size. Here, the area size may represent a size of an area in a plan view. However, this is merely illustrative, and the area sizes of the blue light-emitting region PXA-B, green light-emitting region PXA-G, and red light-emitting region PXA-R are not limited thereto.

FIG. 4 illustrates that the red light-emitting regions PXA-R and the blue light-emitting regions PXA-B are arranged along the second direction DR2 in a first row, and the green light-emitting regions PXA-G are arranged in a second row and spaced apart from the red light-emitting regions PXA-R and the blue light-emitting regions PXA-B. However, this is merely illustrative, and arrangement of the blue light-emitting regions PXA-B, green light-emitting regions PXA-G, and red light-emitting regions PXA-R is not limited thereto. The shape of the light-emitting regions PXA-R, PXA-G, and PXA-B may be generally, for example, an octagon, a square or a diamond with or without rounded corners. It is, however, to be understood that the present inventive concept is not limited thereto. For example, the shape of the light-emitting regions PXA-R, PXA-G, and PXA-B may be a circle, or other polygons with or without rounded corners. The light-emitting regions PXA-R, PXA-G, and PXA-B may have different shapes and/or sizes from each other. Furthermore, shapes of the blue light-emitting regions PXA-B, the green light-emitting regions PXA-G, and the red light-emitting regions PXA-R are not limited to the illustration, and may be defined as different forms.

FIG. 5 is a cross-sectional view taken along line II-II' of FIG. 4. FIG. 5 may be a cross-sectional view illustrating the display module DM. Line II-II' passes through a red light-emitting region PXA-R, a green light-emitting region PXA-G, and a blue light-emitting region PXA-B.

The base layer BS may include a single-layer or multi-layer structure. For example, the base layer BS may include a first synthetic resin layer, a single- or multi-layered intermediate layer, and a second synthetic resin layer, which are sequentially laminated. The intermediate layer may be referred to as a base barrier layer. The multi-layered intermediate layer may include, for example, a silicon oxide ($SiO_x$) layer and an amorphous silicon (a-Si) layer arranged on the silicon oxide ($SiO_x$) layer, but is not particularly limited thereto. For example, the intermediate layer may include at least one of a silicon oxide ($SiO_x$) layer, a silicon nitride ($SiN_x$) layer, a silicon oxynitride (SiON) layer, or an amorphous silicon (a-Si) layer. In an embodiment of the present inventive concept, the intermediate layer may include an inorganic material as a barrier layer.

Each of the first and second synthetic resin layers may include a polyimide-based resin. Furthermore, each of the first and second synthetic resin layers may include at least one of, for example, acrylate-based resin, methacrylate-based resin, polyisoprene-based resin, vinyl-based resin, epoxy-based resin, urethane-based resin, cellulose-based resin, siloxane-based resin, polyimide-based resin, or perylene-based resin. Herein, the term " . . . -based resin" indicates inclusion of a functional group of " . . . ". For example, "siloxane-based resin" indicates the resin including a functional group of "siloxane".

The circuit layer DP-CL may include a plurality of transistors. The transistors each may include a control electrode, an input electrode, and an output electrode. For example, the circuit layer DP-CL may include a switching transistor and a driving transistor for driving the light-emitting element ED of the display element layer DP-ED.

The display element layer DP-ED may include the light-emitting element ED and a pixel defining layer PDL. A pixel opening OH may be defined in the pixel defining layer PDL. The pixel opening OH may expose at least a portion of a first electrode EL1 to be described. For example, the pixel defining layer PDL may include an organic light-shielding material or inorganic light-shielding material including a black pigment and black dye. The light-emitting regions PXA-R, PXA-G, and PXA-B each may be divided by the pixel defining layer PDL. The non-light-emitting regions NPXA may be regions between neighboring light-emitting regions PXA-R, PXA-G, and PXA-B and may correspond to the pixel defining layer PDL, for example, may overlap the pixel defining layer PDL. Herein, the light-emitting regions PXA-R, PXA-G, and PXA-B each may correspond to a pixel PX. The pixel defining layer PDL may divide first to third light-emitting elements ED-1, ED-2, and ED-3. An emission layer EML of the first to third light-emitting elements ED-1 to ED-3 may be divided by being arranged in the pixel openings OH defined in the pixel defining layer PDL.

The light-emitting element ED may include the first to third light-emitting elements ED-1 to ED-3. The first to third light-emitting elements ED-1 to ED-3 may be spaced apart from each other in a direction perpendicular to the thickness direction DR3. The first to third light-emitting elements ED-1 to ED-3 each may include a first electrode EL1, a second electrode EL2 arranged on the first electrode EL1, and the emission layer EML arranged between the first electrode EL1 and the second electrode EL2. Furthermore, the first to third light-emitting elements ED-1 to ED-3 each may include a hole transport region HTR arranged between the first electrode EL1 and the emission layer EML and an electron transport region ETR arranged between the emission layer EML and the second electrode EL2.

The first to third light-emitting elements ED-1 to ED-3 may emit light of different wavelength regions. The first light-emitting element ED-1 may include a first emission layer EML-B that emits first light. The second light-emitting element ED-2 may include a second emission layer EML-G that emits second light different from the first light. The third light-emitting element ED-3 may include a third emission layer EML-R that emits third light different from the first light and second light. The first light may be blue light, the second light may be green light, and the third light may be red light. The blue light-emitting region PXA-B, the green light-emitting region PXA-G, and the red light-emitting region PXA-R may respectively correspond to the first light-emitting element ED-1, the second light-emitting element ED-2, and the third-light emitting element ED-3. For example, the first emission layer EML-B may provide blue light in blue light-emitting region PXA-B, the second emission layer EML-G may provide green light in the green light-emitting region PXA-G, and the third emission layer EML-R may provide red light in the red light-emitting region PXA-R. However, the present inventive concept is not limited thereto, and the first to third light-emitting elements ED-1 to ED-3 may emit light of the same wavelength region or at least one of the first to third light-emitting elements ED-1 to ED-3 may emit light of a different wavelength region. For example, the first to third light-emitting elements ED-1 to ED-3 all may emit blue light or white light.

The first electrode EL1 may be at least partially exposed in the pixel opening OH. The first electrode EL1 may be formed of a metal material, metal alloy, or conductive compound. The first electrode EL1 may be an anode. The first electrode EL1 may be a pixel electrode. However, the present inventive concept is not limited thereto. For example, the first electrode EL1 may be a cathode. The first electrode EL1 may be a transmissive electrode, a transflective electrode, or a reflective electrode. The first electrode EL1 may be a single layer or may have a multi-layer structure.

The hole transport region HTR may be formed of a known hole injection material and/or known hole transport material. The hole transport region HTR may include at least one of a hole injection layer, a hole transport layer, or an electron blocking layer. The hole transport region HTR may entirely overlap the light-emitting regions PXA-R, PXA-B, and PXA-G and the non-light-emitting region NPXA. That is, the hole transport region HTR may be provided as a common layer so as to overlap the light-emitting regions PXA-R, PXA-B, and PXA-G and the non-light-emitting region NPXA. However, the present inventive concept is not limited thereto, and the hole transport region HTR may be patterned so as to be arranged separately in correspondence to the light-emitting regions PXA-R, PXA-B, and PXA-G.

The emission layer EML may include an organic light-emitting material or inorganic light-emitting material. For example, the emission layer EML may include a fluorescent or phosphorescent material. The emission layer EML may also include a quantum dot or a quantum rod as a light-emitting material. In addition, the emission layer EML may include an inorganic light-emitting material, which may include crystalline semiconductors such as, for example, gallium nitride (GaN), indium phosphide (InP), etc.

The electron transport region ETR may be formed of a known electron injection material and/or known electron transport material. The electron transport region ETR may include at least one of an electron injection layer, an electron transport layer, or a hole blocking layer. The electron transport region ETR may entirely overlap the light-emitting regions PXA-R, PXA-B, and PXA-G and the non-light-emitting region NPXA. That is, the electron transport region ETR may be provided as a common layer so as to overlap the light-emitting regions PXA-R, PXA-B, and PXA-G and the non-light-emitting region NPXA. However, the present inventive concept is not limited thereto, and the electron transport region ETR may be patterned so as to be arranged separately in correspondence to the light-emitting regions PXA-R, PXA-B, and PXA-G.

The second electrode EL2 may be a common electrode. The second electrode EL2 may be a cathode. For example, the second electrode EL2 may be a cathode when the first electrode EL1 is an anode. However, the present inventive concept is not limited thereto. For example, the second electrode EL2 may be an anode when the first electrode EL1 is a cathode. The second electrode EL2 may be a transmissive electrode, a transflective electrode, or a reflect electrode. When the second electrode EL2 is a transmissive electrode, the second electrode EL2 may include a transparent metal oxide, for example, indium tin oxide (ITO), indium zinc oxide (IZO), zinc oxide (ZnO), indium tin zinc oxide (ITZO), or the like. Additionally or alternatively, the transparent conductive layer may include a metal nano-wire, a graphene, or a conductive polymer such as poly(3,4-ethylenedioxythiophene) (PEDOT).

The light-emitting element ED may further include a capping layer CPL arranged on the second electrode EL2.

The capping layer CPL may include a single layer or multi-layer. The capping layer CPL may protect the second electrode EL2 from a subsequent process, such as sputtering process, and may increase emission efficiency of the emission layer EML. The capping layer CPL may be an organic layer or inorganic layer. For example, when the capping layer CPL includes an inorganic material, the inorganic material may include alkali metal compounds such as lithium fluoride (LiF), alkali earth metal compounds such as magnesium fluoride ($MgF_2$), and silicon oxynitride (SiON), silicon nitride ($SiN_x$), silicon oxide ($SiO_x$), etc. For example, when the capping layer CPL includes an organic material, the organic material may include N,N'-bis(1-naphthyl)-N,N'-diphenyl-1,1'-biphenyl-4,4'-diamine (α-NPD), N,N'-di(naphthalene-1-yl)-N,N'-diphenyl-benzidine (NPB), N,N'-bis(3-methylphenyl)-N,N-diphenyl-[1,1-biphenyl]-4,4'-diamine (TPD), 4,4',4"-tris(3-methylphenylphenylamino)triphenylamine (m-MTDATA), Tris(8-hydroxyquinoline) aluminum ($Alq_3$), copper phthalocyanine (CuPc), N4, N4, N4', N4'-tetra(biphenyl-4-yl)biphenyl-4,4'-diamine (TPD15), and 4,4',4"-Tris (carbazol-9-yl) triphenylamine (TCTA), or may include an epoxy resin or acrylate such as methacrylate. However, this is merely illustrative, and a material of the capping layer CPL is not limited thereto.

The capping layer CPL may have a refractive index greater than that of an inorganic deposition layer INF to be described. The capping layer CPL may have a refractive index of at least about 1.6. In detail, the refractive index of the layer CPL may be at least about 1.6 with respect to light of a wavelength range of about 550 nm to about 660 nm.

The display element layer DP-ED may further include an inorganic deposition layer INF arranged on the light-emitting element ED. The inorganic deposition layer INF may include an inorganic material having low light reflectance, and may include metal or metal oxide. When the inorganic deposition layer INF include metal, the inorganic deposition layer INF may include, for example, ytterbium (Yb), bismuth (Bi), cobalt (Co), molybdenum (Mo), titanium (Ti), zirconium (Zr), aluminum (Al), chromium (Cr), niobium (Nb), platinum (Pt), tungsten (W), indium (In), tin (Sn), iron (Fe), nickel (Ni), tantalum (Ta), manganese (Mn), zinc (Zn), germanium (Ge), silver (Ag), magnesium (Mg), gold (Au), copper (Cu), calcium (Ca), or combinations thereof. Furthermore, when the inorganic deposition layer INF includes a metal oxide, the inorganic deposition layer INF may include, for example, silicon oxide ($SiO_x$), titanium oxide ($TiO_2$), zirconium oxide ($ZrO_2$), tantalum oxide ($Ta_2O_5$), hafnium oxide ($HfO_2$), aluminum oxide ($Al_2O_3$), zinc oxide (ZnO), yttrium oxide ($Y_2O_3$), beryllium oxide (BeO), magnesium oxide (MgO), lead oxide ($PbO_2$), tungsten oxide ($WO_3$), silicon nitride ($SiN_x$), lithium fluoride (LiF), calcium fluoride ($CaF_2$), magnesium fluoride ($MgF_2$), cadmium sulfide (CdS), or combinations thereof. For example, the inorganic deposition layer INF may be formed by depositing bismuth (Bi) or by co-depositing bismuth (Bi) and ytterbium (Yb).

The inorganic deposition layer INF may have a refractive index of at least about 1.0. The inorganic deposition layer INF may have an absorption coefficient (k) of at least about 0.5. The inorganic deposition layer INF may induce destructive interference of light that has entered the display device DD and light emitted from metal (e.g., second electrode) arranged under the inorganic deposition layer INF, thus reducing external light reflectance. The display device DD including the inorganic deposition layer INF may provide enhanced display quality and light efficiency.

The encapsulation layer TFE may be arranged on the display element layer DP-ED, and may seal the display element layer DP-ED. The encapsulation layer TFE may include at least one inorganic film (hereinafter referred to as an inorganic encapsulation film). Furthermore, the encapsulation layer TFE may include at least one organic film (hereinafter referred to as an organic encapsulation film) and at least one inorganic encapsulation film.

The inorganic encapsulation film may protect the display element layer DP-ED from moisture/oxygen, and the organic encapsulation film may protect the display element layer DP-ED from foreign matter such as dust particles. The organic encapsulation film may provide a flat top surface, and may relieve stress between layers in contact with each other. The inorganic encapsulation film may include silicon nitride ($SiN_x$), silicon oxynitride (SiON), silicon oxide ($SiO_x$), titanium oxide ($TiO_2$), or aluminum oxide ($Al_2O_3$), but is not particularly limited thereto. The organic encapsulation film may include an acryl-based compound or polymer, epoxy-based compound or polymer, and the like. The organic encapsulation film may include a photopolymerizable organic material, but is not particularly limited.

The input sensing layer ISP may include an organic layer IS-OL, a second conductive pattern layer IS-CL2, and an inorganic layer IS-IL. Furthermore, the input sensing layer ISP may include a base insulating layer IS-BS and a first conductive pattern layer IS-CL1. The first conductive pattern layer IS-CL1 may be arranged on the base insulating layer IS-BS. The organic layer IS-OL may cover the first conductive pattern layer IS-CL1 and may be arranged on the base insulating layer IS-BS. The second conductive pattern layer IS-CL2 may be arranged on the organic layer IS-OL. The inorganic layer IS-IL may cover the second conductive pattern layer IS-CL2 and may be arranged on the organic layer IS-OL.

Each of the first conductive pattern layer IS-CL1 and the second conductive pattern layer IS-CL2 may include a plurality of conductive patterns. The conductive patterns may include a plurality of sensing electrodes E1-1 to E1-5 and E2-1 to E2-4. (refer to FIG. 13) and a plurality of signal lines SL1 and SL2 (refer to FIG. 13) respectively connected with the plurality of sensing electrodes E1-1 to E1-5 and E2-1 to E2-4.

The first conductive pattern layer IS-CL1 and the second conductive pattern layer IS-CL2 may each have a single-layer structure or may have a multi-layer structure laminated along the third direction DR3. The conductive pattern layers IS-CL1 and IS-CL2 of a single-layer structure may include a metal layer or a transparent conductive layer. The metal layer may include molybdenum (Mo), silver (Ag), titanium (Al), copper (Cu), aluminum (Al), or an alloy thereof. The transparent conductive layer may include a transparent conductive oxide such as indium tin oxide (ITO), indium zinc oxide (IZO), zinc oxide (ZnO), indium zinc tin oxide (IZTO), or the like. Furthermore, the transparent conductive layer may include a conductive polymer such as poly(3,4-ethylenedioxythiophene) (PEDOT), metal nanowire, graphene, or the like.

The conductive pattern layers IS-CL1 and IS-CL2 of a multi-layer structure may include metal layers. The metal layers may have, for example, a triple-layer structure of titanium (Ti)/aluminum (Al)/titanium (Ti) or molybdenum (Mo)/copper (Cu)/molybdenum (Mo). The conductive pattern layers IS-CL1 and IS-CL2 of a multi-layer structure may include at least one metal layer and at least one transparent conductive layer.

The first and second conductive pattern layers IS-CL1 and IS-CL2 may overlap the non-light-emitting region NPXA. A conductive opening CL-OH corresponding to the light-emitting regions PXA-B, PXA-G, and PXA-R may be defined in the second conductive pattern layer IS-CL2. For example, a width of the conductive opening CL-OH may be larger than a width W1 of the pixel opening OH in a direction perpendicular to the thickness direction DR3.

The base insulating layer IS-BS may be an inorganic layer including at least one of silicon nitride ($SiN_x$), silicon oxynitride (SiON), or silicon oxide ($SiO_x$). Alternatively, the base insulating layer IS-BS may be an organic layer including epoxy resin, acryl resin, or imide-based resin. The base insulating layer IS-BS may have a single-layer structure, or may have a multi-layer structure laminated along the third direction DR3. The base insulating layer IS-BS may be directly arranged on the encapsulation layer TFE. Unlike the illustration, the base insulating layer IS-BS may not be provided, and the first conductive pattern layer IS-CL1 may be directly arranged on the encapsulation layer TFE. Alternatively, the base insulating layer IS-BS may be formed on a separate base layer, and an adhesive member may be used to couple the separate base layer to the display panel DP.

The organic layer IS-OL may cover the first conductive pattern layer IS-CL1. The organic layer IS-OL may be formed to a thickness enough to cover the first conductive pattern layer IS-CL1 having a thickness of at least about 6000 Å, and may maintain reliability of the display device DD. For example, the thickness of the organic layer IS-OL may be about 15,000 Å to about 20,000 Å. However, this is merely illustrative, and the thickness range of the organic layer IS-OL is not limited thereto.

A layer having a relatively thick thickness is required to be formed to cover the first conductive pattern layer IS-CL1 having a thickness of at least about 6000 Å. When an inorganic layer including an inorganic material is formed to a relatively thick thickness, a seam may be formed in the inorganic layer including an inorganic material, thus deteriorating reliability. On the contrary, the display device DD of an embodiment of the present inventive concept, provided with the organic layer IS-OL including an organic material to cover the first conductive pattern layer IS-CL1 having a thickness of at least about 6000 Å, may exhibit excellent reliability. The organic layer IS-OL may provide a flat top surface on the base insulating layer IS-BS.

The organic layer IS-OL may include an organic material and may be formed via a solution process such as spin coating, slit coating, or inkjet process. The organic layer OL may include a polymer-based material. For example, the organic layer IS-OL may include at least one of, for example, acrylic resin, methacrylic resin, polyisoprene, vinyl-based resin, epoxy-based resin, urethane-based resin, cellulosic resin, siloxane resin, polyimide-based resin, polyimide-based resin, or perylene-based resin. However, this is merely illustrative, and the organic material included in the organic layer IS-OL is not limited thereto.

A contact hole CN may be defined in the organic layer IS-OL. The first conductive pattern layer IS-CL1 and the second conductive pattern layer IS-CL2 may be electrically connected through the contact hole CN formed in the organic layer IS-OL disposed between the first conductive pattern layer IS-CL1 and the second conductive pattern layer IS-CL2. The contact hole CN may be filled with a material of the second conductive pattern layer IS-CL2. Although FIG. 5 illustrates one contact hole CN, the present inventive concept is not limited thereto, and a plurality of contact holes may be defined.

The inorganic layer IS-IL may cover the second conductive pattern layer IS-CL2. The inorganic layer IS-IL may be arranged between the second conductive pattern layer IS-CL2 and the optical layer RCL. The inorganic layer IS-IL may prevent the second conductive pattern layer IS-CL2 from contacting the optical layer RCL. Accordingly, a material (e.g., organic layer) that forms the optical layer RCL may be prevented from damaging the second conductive pattern layer IS-CL2.

The inorganic layer IS-IL may include at least one of, for example, aluminum oxide ($Al_2O_3$), titanium oxide ($TiO_2$), silicon oxide ($SiO_x$), silicon oxynitride (SiON), zirconium oxide ($ZrO_2$), or hafnium oxide ($HfO_2$). However, this is merely illustrative, and the inorganic material included in the inorganic layer IS-IL is not limited thereto.

According to an embodiment of the present inventive concept, an opening IL-OH may be defined in the inorganic layer IS-IL. The opening IL-OH may be formed penetrating the inorganic layer IS-IL in the thickness direction DR3. The opening IL-OH of the inorganic layer IS-IL may overlap the pixel opening OH and may not overlap the first and second conductive pattern layers IS-CL1 and IS-CL2. For example, the first and second conductive pattern layers IS-CL1 and IS-CL2 may not overlap the light-emitting regions PXA-R, PXA-G, and PXA-B, and may overlap the non-light-emitting region NPXA, and thus, may not be overlapped by the opening IL-OH of the inorganic layer IS-IL. The opening IL-OH defined in the inorganic layer IS-IL may be a portion of the inorganic layer IS-IL removed to expose the top surface of the organic layer IS-OL. Herein, when a component is referred to as "overlapping" another component, the component and the other component are not limited to the case of having the same area size and same shape, and may have different shapes and/or different area sizes. Also, when a component is referred to as "overlapping" another component, the component overlaps the other component in the thickness direction of the display devise DD or the third direction DR3, unless otherwise specified.

The opening IL-OH may be a passage for discharging gas generated due to outgassing of the organic layer IS-OL. When the gas generated due to the outgassing cannot be discharged, a component (e.g., light-emitting element) of a display device may be damaged, thus deteriorating the reliability of the display device. In an embodiment of the present inventive concept, the display device DD including the inorganic layer IS-IL arranged on the organic layer IS-OL and having the opening IL-OH defined therein may have a characteristic of facilitating discharge of gas generated due to the outgassing of the organic layer IS-OL. Accordingly, the display device DD of an embodiment of the present inventive concept may exhibit excellent reliability.

The opening IL-OH may overlap at least one of the first emission layer EML-B of the first light-emitting element ED-1, the second emission layer EML-G of the second light-emitting element ED-2, or the third emission layer EML-R of the third light-emitting element ED-3. In this case, three openings IL-OH respectively overlap the first to third emission layers EML-B, EML-G and EML-R. Alternatively, one opening IL-OH overlaps one of the emission layers EML-B, EML-G and EML-R, and the other two of the emission layers EML-B, EML-G and EML-R are not overlapped by the openings IL-OH. Alternatively, two openings IL-OH respectively overlap two of the emission layers EML-B, EML-G and EML-R, and the other one of the emission layers EML-B, EML-G and EML-R is not overlapped by the opening IL-OH. As described above, the first to third emission layers EML-B, EML-G, and EML-R may be separately arranged in the pixel openings OH. The opening IL-OH overlapping the pixel opening OH may overlap at least one of the first to third emission layers EML-B, EML-G, and EML-R. In an embodiment of the present inventive concept, one or more openings IL-OH that respectively overlap at least one of the first to third emission layers EML-B, EML-G, and EML-R and do not overlap the first and second conductive pattern layers IS-CL1 and IS-CL2 are defined in the inorganic layer IS-IL.

Figure 8:
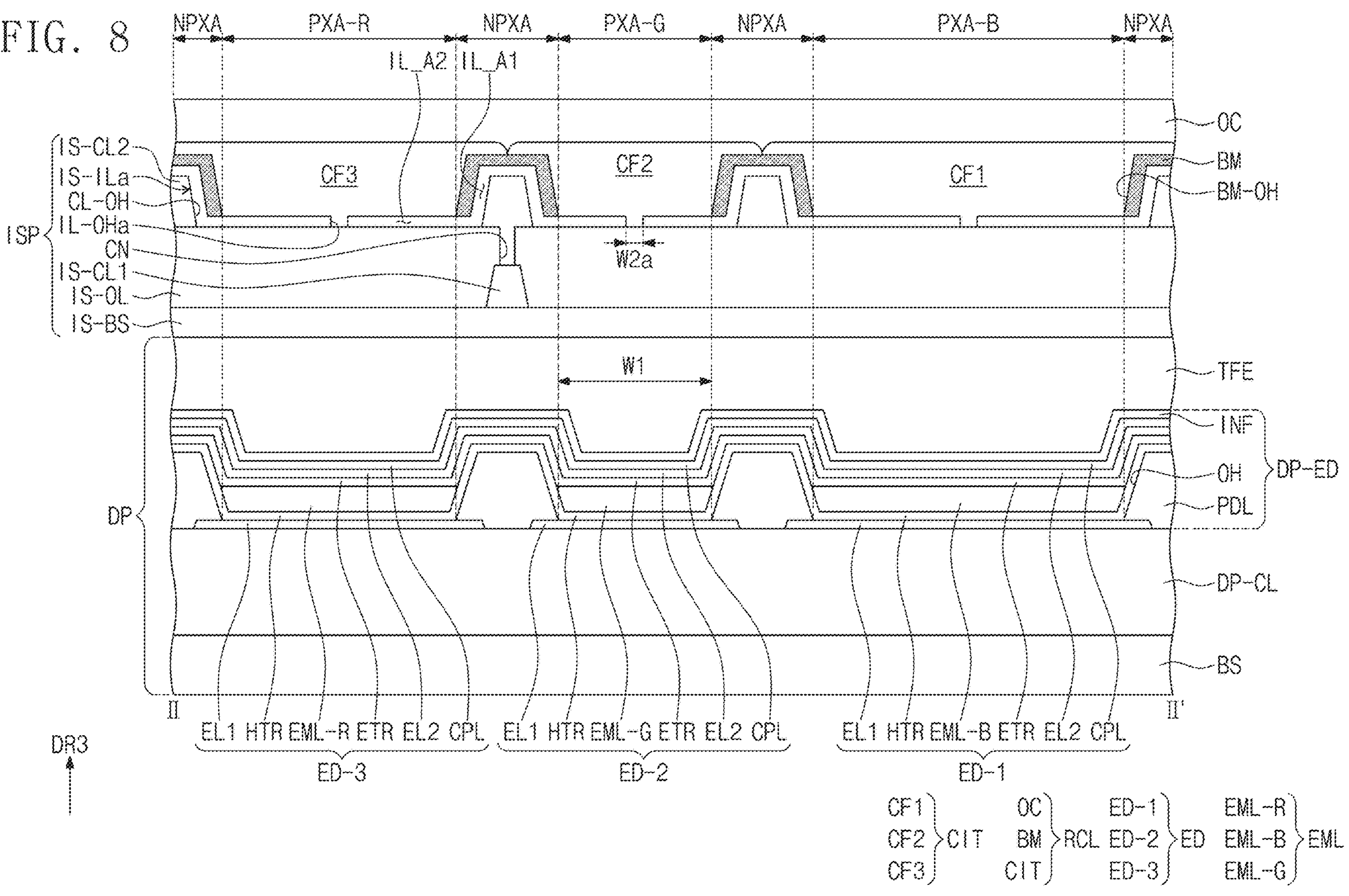
FIG. 8 is a cross-sectional view illustrating a portion of a display device according to an embodiment of the present inventive concept.
Figure 9:
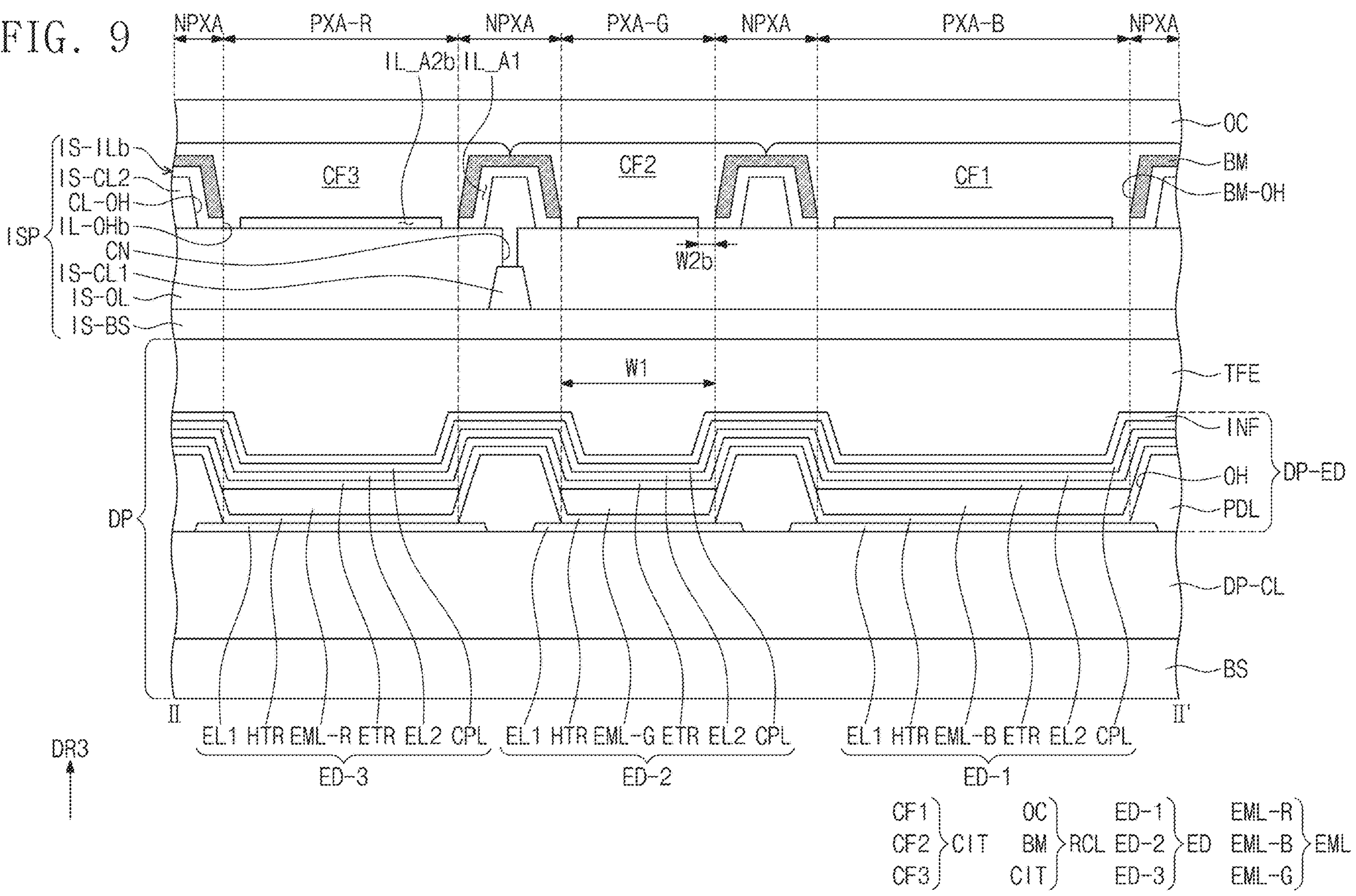
FIG. 9 is a cross-sectional view illustrating a portion of a display device according to an embodiment of the present inventive concept.

A width W2 of the opening IL-OH may be equal to or smaller than the width W1 of the pixel opening OH in a direction perpendicular to the thickness direction DR3. Although FIG. 5 illustrates that the width W2 of the opening IL-OH is substantially equal to the width W1 of the pixel opening OH, the present inventive concept is not limited thereto. The width W2 of the opening IL-OH may be changed so as to facilitate discharge of gas generated due to the outgassing of the organic layer IS-OL. FIGS. 8 and 9 that will be described later illustrate that a width W2*a* or W2*b* of the opening IL-OH is smaller than the width W1 of the pixel opening OH. The opening IL-OHa having the width W2*a* overlaps the central portion of the pixel opening OH, while the opening IL-OHb having the width W2*b* overlaps the edge portions of the pixel opening OH. FIGS. 8 and 9 will be describe in more detail later.

The optical layer RCL may include a pigment or dye. The optical layer RCL may include a filter part CIT and a pattern part BM. The filter part CIT may include first to third filters CF1 to CF3 respectively overlapping the first to third light-emitting elements ED-1 to ED-3. The first to third filters CF1 to CF3 may respectively overlap the first to third emission layers EML-B, EML-G, and EML-R.

The first to third color filters CF1 to CF3 each may include a pigment or dye. For example, the first filter CF1 may be a blue filter, the second filter CF2 may be a green filter, and the third filter CF3 may be a red filter. For example, optical layer RCL may include the first filter CF1 for transmitting light of a blue wavelength region, the second filter CF2 for transmitting light of a green wavelength region, and the third filter CF3 for transmitting light of a red wavelength region. The first to third filters CF1 to CF3 disposed in the pixels PX can enhance color purity of lights emitted from the emission areas of the respective pixels PX. Accordingly, the optical layer RCL including the first to third filters CF1 to CF3 may enhance display quality of the display device DD.

At least one of the first to third filters CF1 to CF3 may contact the organic layer IS-OL through the opening IL-OH of the inorganic layer IS-IL. The pigment or dye included in each of the first to third filters CF1 to CF3 may fill the opening IL-OH of the inorganic layer IS-IL.

A pattern opening BM-OH may be defined in the pattern part BM. The pattern part BM may block light emitted and may also suppress reflection of external light. The opening IL-OH of the inorganic layer IS-IL may overlap the pattern opening BM-OH. The first to third filters CF1 to CF3 may fill the pattern opening BM-OH. Here, although the pattern opening BM-OH is shown in singular form, it may include plural form, for example, the first to third filters CF1 to CF3 may fill three pattern openings BM-OH. The pattern part BM, which has a black color, may include a black coloring agent. The black coloring agent may include a black dye or black pigment. The black coloring agent may include metals such as carbon black and chromium, or oxides thereof. However, this is merely illustrative, and a material of the pattern part BM is not particularly limited provided that the material absorbs light.

The optical layer RCL may further include an overcoat layer OC arranged on the filter part CIT and the pattern part BM. The overcoat layer OC may include an organic material. The overcoat layer OC may be a planarization layer. The overcoat layer OC covers and protects the optical layer RCL. In an embodiment of the present inventive concept, the overcoat layer OC may also provide a flat top surface.

Figure 6A:
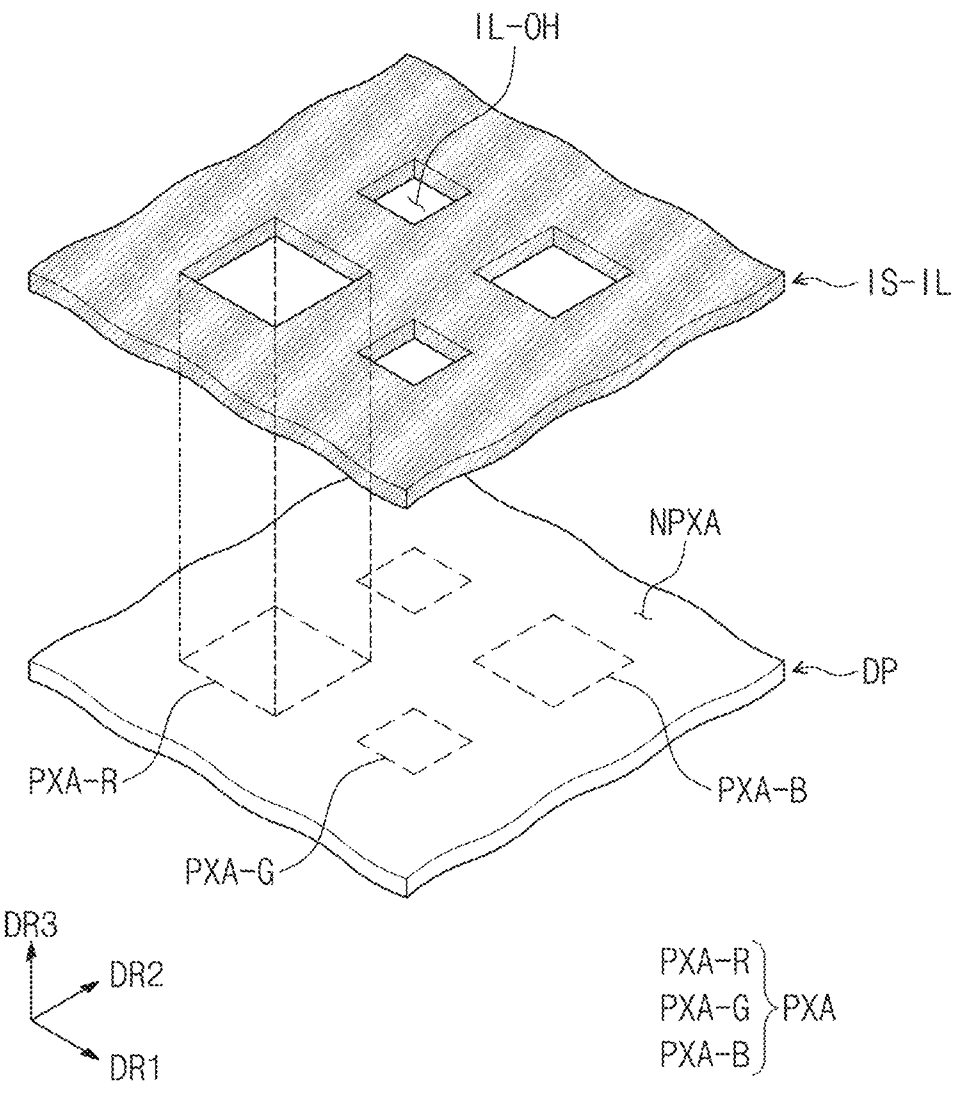
FIG. 6A is a perspective view illustrating a portion of a display device according to an embodiment of the present inventive concept.
Figure 6B:
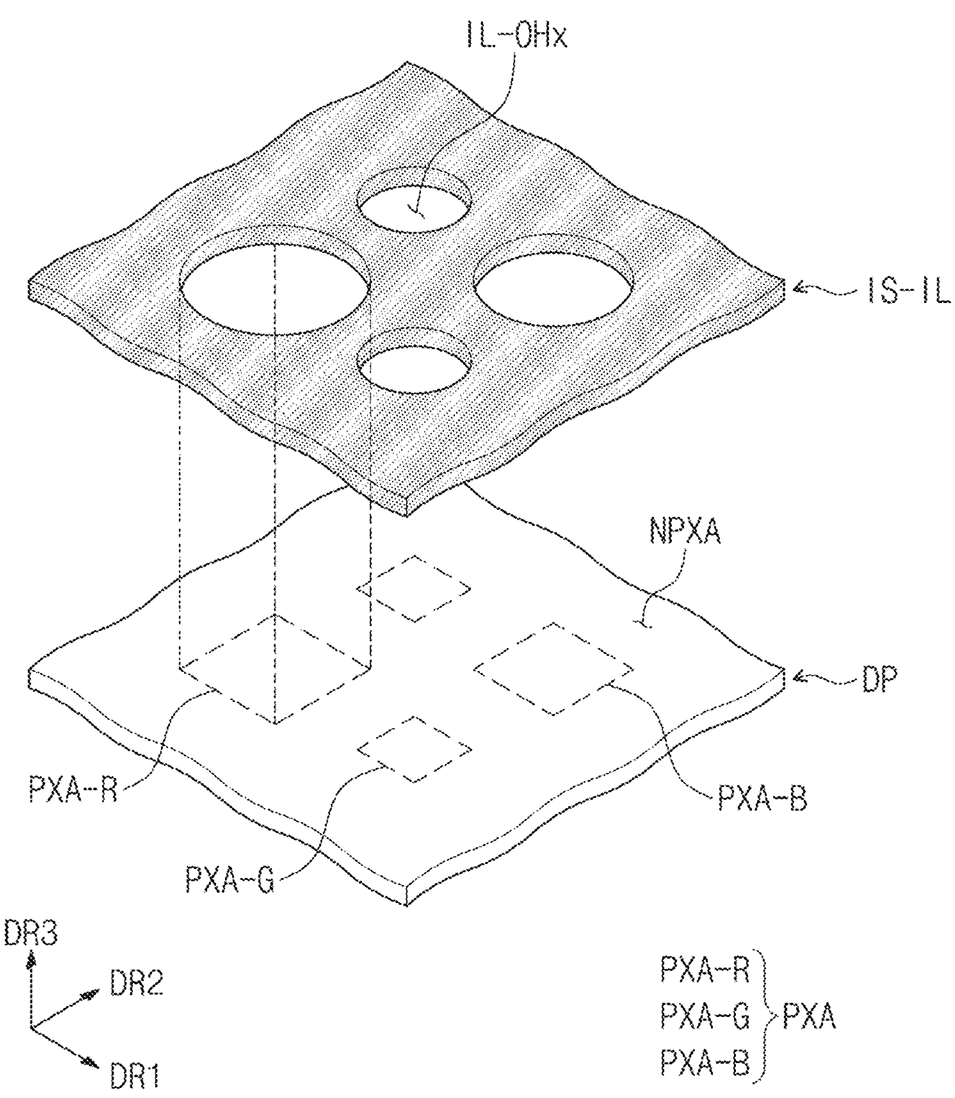
FIG. 6B is a perspective view illustrating a portion of a display device according to an embodiment of the present inventive concept.

FIGS. 6A and 6B are perspective views illustrating the inorganic layer IS-IL arranged on the display panel DP. For convenience, the display panel DP and the inorganic layer IS-IL are schematically illustrated in FIGS. 6A and 6B.

Referring to FIG. 6A, in a plan view, an area size and shape of the opening IL-OH of the inorganic layer IS-IL may be substantially the same as an area size and shape of the light-emitting region PXA. Here, the term "substantially the same" indicates not only the case where numerical values are physically the same but also the case where there is a difference within a range of process error that may occur typically.

In a plan view, the opening IL-OH of the inorganic layer IS-IL may have a polygonal shape. Although FIG. 6A illustrates the opening IL-OH of the inorganic layer IS-IL as having a quadrilateral shape, the present inventive concept is not limited thereto. The light-emitting regions PXA-R, PXA-G, and PXA-B may have different shapes and/or sizes from each other corresponding to the different shapes and/or sizes of the openings IL-OH of the inorganic layer IS-IL.

FIG. 6B illustrates an embodiment of the present inventive concept, which differs in the shape of the opening IL-OHx in a plan view compared to FIG. 6A. Referring to FIG. 6B, the opening IL-Ohx of the inorganic layer IS-IL may have a circular shape in a plan view. In the opening IL-Ohx having a circular shape, a diameter of a circle may be substantially the same as a diagonal length of the light-emitting region PXA having a quadrilateral shape. In an embodiment of the present inventive concept, the shapes and area sizes of the openings IL-OH and IL-Ohx are not limited to those illustrated in FIGS. 6A and 6B, and may be variously changed so as to facilitate discharge of gas generated due to the outgassing. In other words, the openings IL-OH of the inorganic layer IS-IL may be variously changed and may have shapes and/or sizes different from the shapes and/or sizes of the light-emitting regions PXA-R, PXA-G, and PXA-B to facilitate discharge of gas generated due to the outgassing.

Figure 7A:
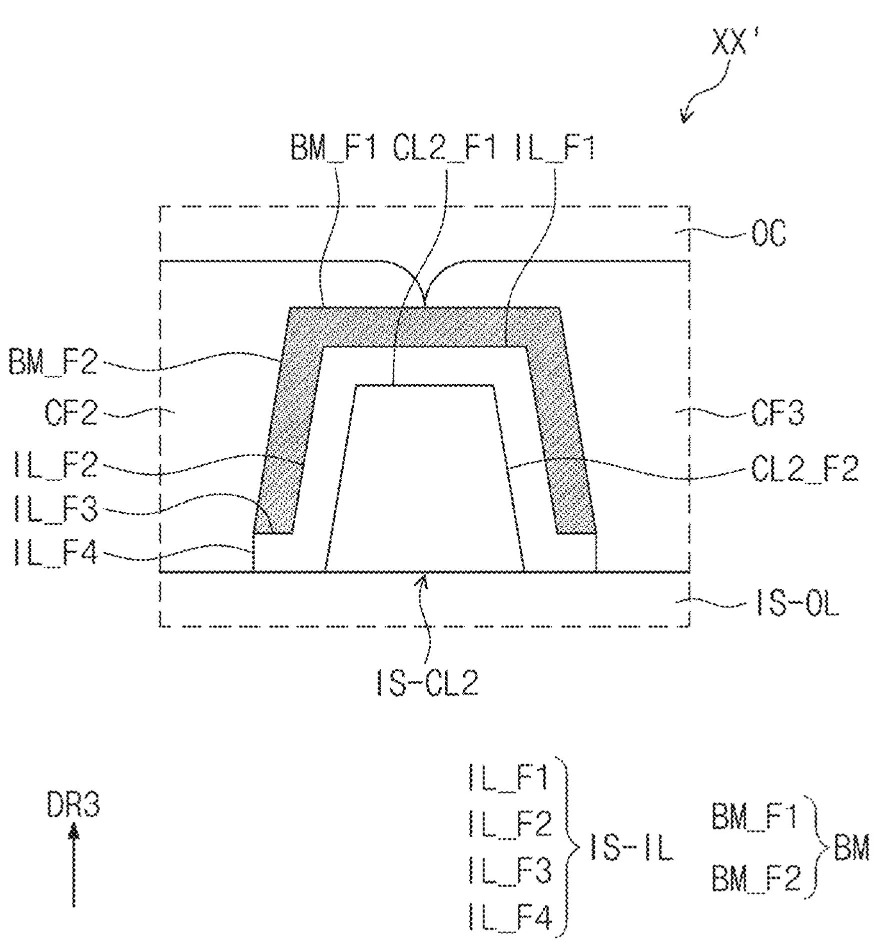
FIG. 7A is an enlarged cross-sectional view of region XX' of FIG. 5.

FIG. 7A is an enlarged cross-sectional view of the region XX' of FIG. 5. The second conductive pattern layer IS-CL2 may include a conductive line. The second conductive pattern layer IS-CL2 may include a regularly arranged conductive line. Hereinafter, the conductive line will be referred to by the same reference sign as the second conductive pattern layer IS-CL2.

Referring to FIGS. 5 and 7A, the conductive line IS-CL2 may overlap the pixel defining layer PDL. Referring to FIG. 7A, in a cross-sectional view, the conductive line IS-CL2 may include a first face CL2_F1 parallel with a top surface of the organic layer IS-OL and a second face CL2_F2 inclined with respect to the first face CL2_F1. For example, in a cross-sectional view, the conductive line IS-CL2 may have a trapezoidal shape having an upper surface and a lower surface that are perpendicular to the thickness direction DR3. The first face CL2_F1 may be the upper surface and the second face CL2_F2 may be a side surface of the conductive line IS-CL2.

The inorganic layer IS-IL may cover the first and second faces CL2_F1 and CL2_F2 of the conductive line IS-CL2. In a cross-sectional view, the inorganic layer IS-IL may include first to fourth faces IL_F1 to IL_F4. The first face IL_F1 and the third face IL_F3 of the inorganic layer IS-IL may be parallel with the first face CL2_F1 of the conductive line IS-CL2, and the second face IL_F2 and the fourth face IL_F4 of the inorganic layer IS-IL may be parallel with the second face CL2_F2 of the conductive line IS-CL2. The fourth face IL_F4 of the inorganic layer IS-IL may be less inclined with respect to the second face CL2_F2 of the conductive line IS-CL2. The fourth face IL_F4 of the inorganic layer IS-IL may be a face that substantially defines the opening IL-OH (FIG. 4). The first face IL_F1 and the third face IL_F3 of the inorganic layer IS-IL may be two upper surfaces located at different levels, with the first face IL_F1 as an uppermost surface of the inorganic layer IS-IL. The second face IL_F2 and the fourth face IL_F4 of the inorganic layer IS-IL may be two side surfaces connected to each other by the third face IL_F3.

In the inorganic layer IS-IL, the second face IL_F2 may be arranged between the first face IL_F1 and the third face IL_F3. The third face IL_F3 may be arranged between the second face IL_F2 and the fourth face IL_F4.

The pattern part BM may cover the first to third faces IL_F1 to IL_F3 of the inorganic layer IS-IL but may not cover the fourth face IL_F4 of the inorganic layer IS-IL. In a cross-sectional view, the pattern part BM may include a first face BM_F1 and a second face BM_F2 inclined with respect to the first face BM_F1. The first face BM_F1 of the pattern part BM may be parallel with the first face CL2_F1 of the conductive line IS-CL2. The second face BM_F2 of the pattern part BM may be parallel with the second face CL2_F2 of the conductive line IS-CL2. The first face BM_F1 may be an upper surface and the second face BM_F2 may be a side surface of the pattern part BM.

Figure 7B:
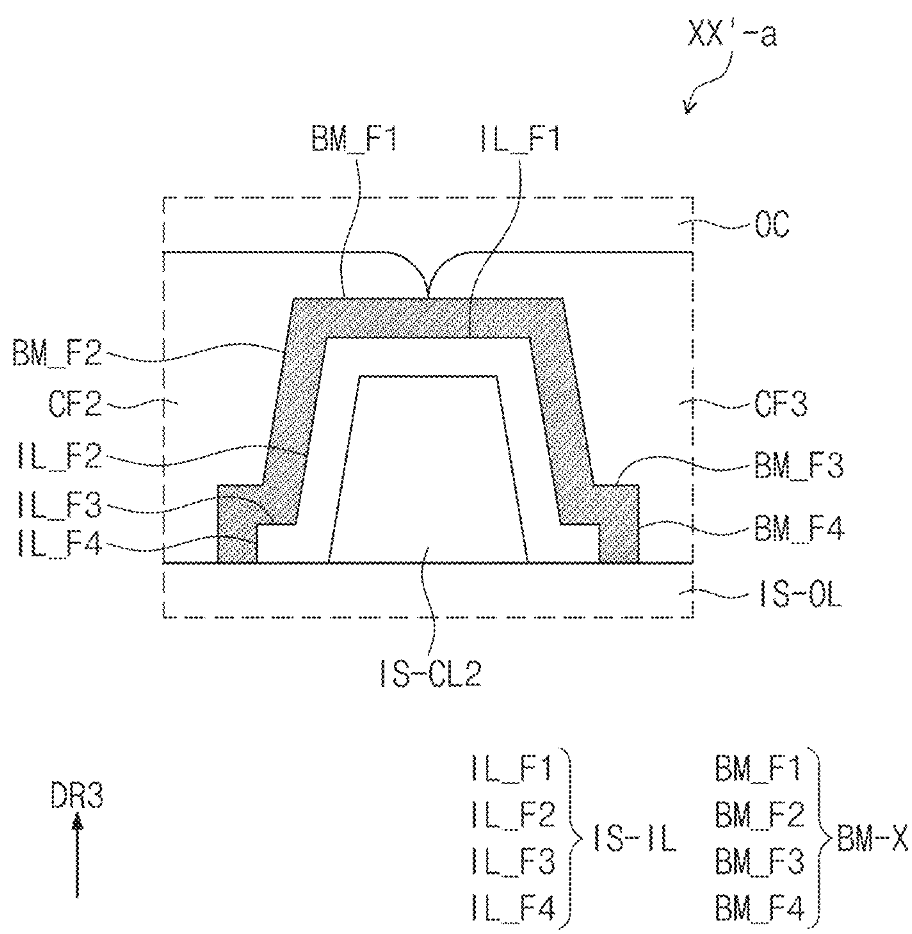
FIG. 7B is a cross-sectional view illustrating a portion of a display device according to an embodiment of the present inventive concept.

FIG. 7B is a cross-sectional view illustrating a region XX'-a that is another example of the region XX'. Compared to FIG. 7A, FIG. 7B is different with respect to a shape of the pattern part BM-X. To provide descriptions with reference to FIG. 7B, descriptions that overlap with the descriptions provided with reference to FIGS. 1 to 7A will not be provided, and differences will be mainly described.

Compared to the pattern part BM of FIG. 7A, the pattern part BM-X of FIG. 7B is different in further including third and fourth faces BM_F3 and BM_F4. The pattern part BM-X may cover the first to fourth faces IL_F1 to IL_F4 of the inorganic layer IS-IL.

Referring to FIG. 7B, the third face BM_F3 of the pattern part BM-X may be parallel with the third face IL_F3 of the inorganic layer IS-IL. The fourth face BM_F4 of the pattern part BM-X may be parallel with the fourth face IL_F4 of the inorganic layer IS-IL. A material that forms the pattern part BM-X may fill a portion of the opening IL-OH (FIG. 5) of the inorganic layer IS-IL. A portion of the pattern part BM-X may contact the organic layer IS-OL through the opening IL-OH (FIG. 5). In the present embodiment, the pattern opening BM-OH of the pattern part BM-X may be smaller than the opening IL-OH of the inorganic layer IS-IL.

Figure 7C:
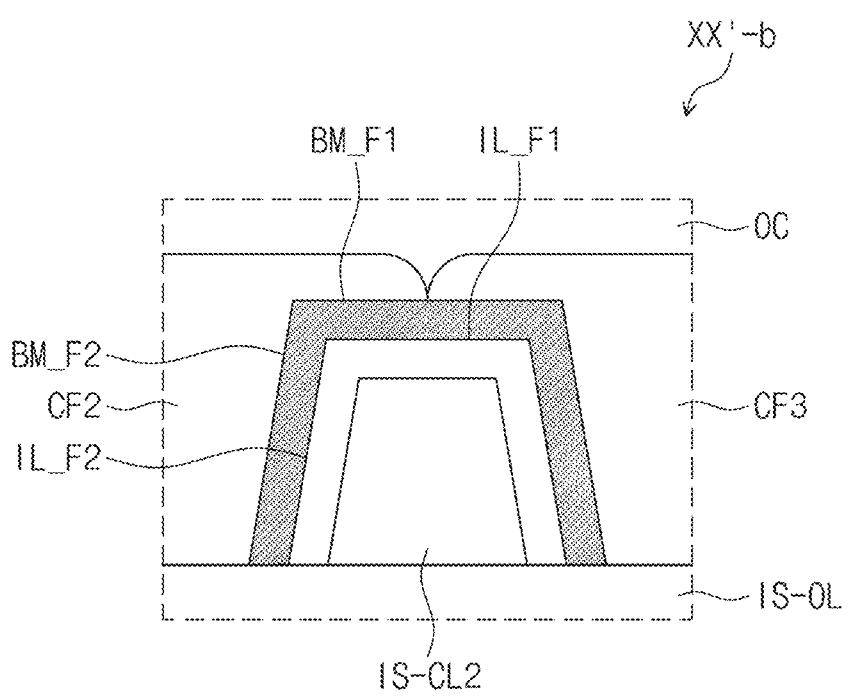
FIG. 7C is a cross-sectional view illustrating a portion of a display device according to an embodiment of the present inventive concept.
Figure 7C:

FIG. 7C is a cross-sectional view illustrating a region XX'-b that is another example of the region XX'. Compared to FIG. 7A, FIG. 7C is different with respect to a shape of the inorganic layer IS-ILy. To provide descriptions with reference to FIG. 7C, descriptions that overlap with the descriptions provided with reference to FIGS. 1 to 7B will not be provided, and differences will be mainly described.

Compared to the inorganic layer IS-IL of FIG. 7A, the inorganic layer IS-ILy of FIG. 7C is different in not including the third and fourth faces IL_F3 and IL_F4 (FIG. 7A). Referring to FIG. 7C, in a cross-sectional view, the inorganic layer IS-ILy may include the first face IL_F1 and the second face IL_F2 inclined with respect to the first face IL_F1. The second face IL_F2 of the inorganic layer IS-ILy may be a face that defines the opening IL-OH (FIG. 5).

The pattern part BM may cover the first face IL_F1 and the second face IL_F2 of the inorganic layer IS-ILy. The first face BM_F1 of the pattern part BM may be parallel with the first face IL_F1 of the inorganic layer IS-ILy, and the second face BM_F2 of the pattern part BM may be parallel with the second face IL_F2 of the inorganic layer IS-ILy. A material that forms the pattern part BM may fill a portion of the opening IL-OH (FIG. 5) of the inorganic layer IS-ILy. A portion of the pattern part BM may contact the organic layer IS-OL through the opening IL-OH (FIG. 5). In the present embodiment, the pattern opening BM-OH of the pattern part BM may be smaller than the opening IL-OH of the inorganic layer IS-ILy.

FIG. 8 is a cross-sectional view illustrating an embodiment of the present inventive concept, and is different with respect to the width W2a of the opening IL-OHa of the inorganic layer IS-ILa compared to FIG. 5. To provide descriptions with reference to FIG. 8, descriptions that overlap with the descriptions provided with reference to FIGS. 1 to 7C will not be provided, and differences will be mainly described.

Referring to FIG. 8, the width W2a of the opening IL-OHa may be smaller than the width W1 of the pixel opening OH. The opening IL-OHa may be formed so as to overlap a center region and not to overlap an edge region of the first to third emission layers EML-B, EML-G, and EML-R in the thickness direction DR3. The edge region of the first to third emission layers EML-B, EML-G, and EML-R may be a region adjacent to the pixel defining layer PDL. The center region of the first to third emission layers EML-B, EML-G, and EML-R may be a region spaced apart from the pixel defining layer PDL with the edge region therebetween.

The inorganic layer IS-ILa may be divided into a first region IL_A1 overlapping the pixel defining layer PDL and a second region IL_A2 not overlapping the pixel defining layer PDL. The second region IL_A2 may extend from the first region IL_A1. The second region IL_A2 may overlap the emission layer EML. The first region IL_A1 and the opening IL-OHa may be spaced apart from each other with the second region IL_A2 therebetween. In the present embodiment, the pattern opening BM-OH of the pattern part BM may be larger than the opening IL-OHa of the inorganic layer IS-ILa.

FIG. 9 is a cross-sectional view illustrating an embodiment of the present inventive concept, and is different with respect to the width W2b of the opening IL-OHb of the inorganic layer IS-ILb and the number of the openings IL-OHb overlapping the first to emission layers EML-B, EML-G, and EML-R compared to FIG. 5. To provide descriptions with reference to FIG. 9, descriptions that overlap with the descriptions provided with reference to FIGS. 1 to 8 will not be provided, and differences will be mainly described.

Referring to FIG. 9, the width W2b of the opening IL-OHb may be smaller than the width W1 of the pixel opening OH. The opening IL-OHb may be formed so as to overlap an edge region and not to overlap a center region of the first to third emission layers EML-B, EML-G, and EML-R in the thickness direction DR3.

The opening IL-OHb may be formed so as to overlap edge regions on both sides of the first to third emission layers EML-B, EML-G, and EML-R in the thickness direction DR3. Accordingly, the first to third emission layers EML-B, EML-G, and EML-R may each overlap two openings IL-OHb in the thickness direction DR3.

The first region IL_A1 of the inorganic layer IS-ILb may overlap the pixel defining layer PDL, and the second region IL_A2b of the inorganic layer IS-ILb may not overlap the pixel defining layer PDL. The second region IL_A2b may overlap the emission layer EML. The second region IL_A2b may be spaced apart from the first region IL_A1 with the opening IL-OHb therebetween. In the present embodiment, the pattern opening BM-OH of the pattern part BM may be larger than the opening IL-OHb of the inorganic layer IS-ILb.

Figure 10:
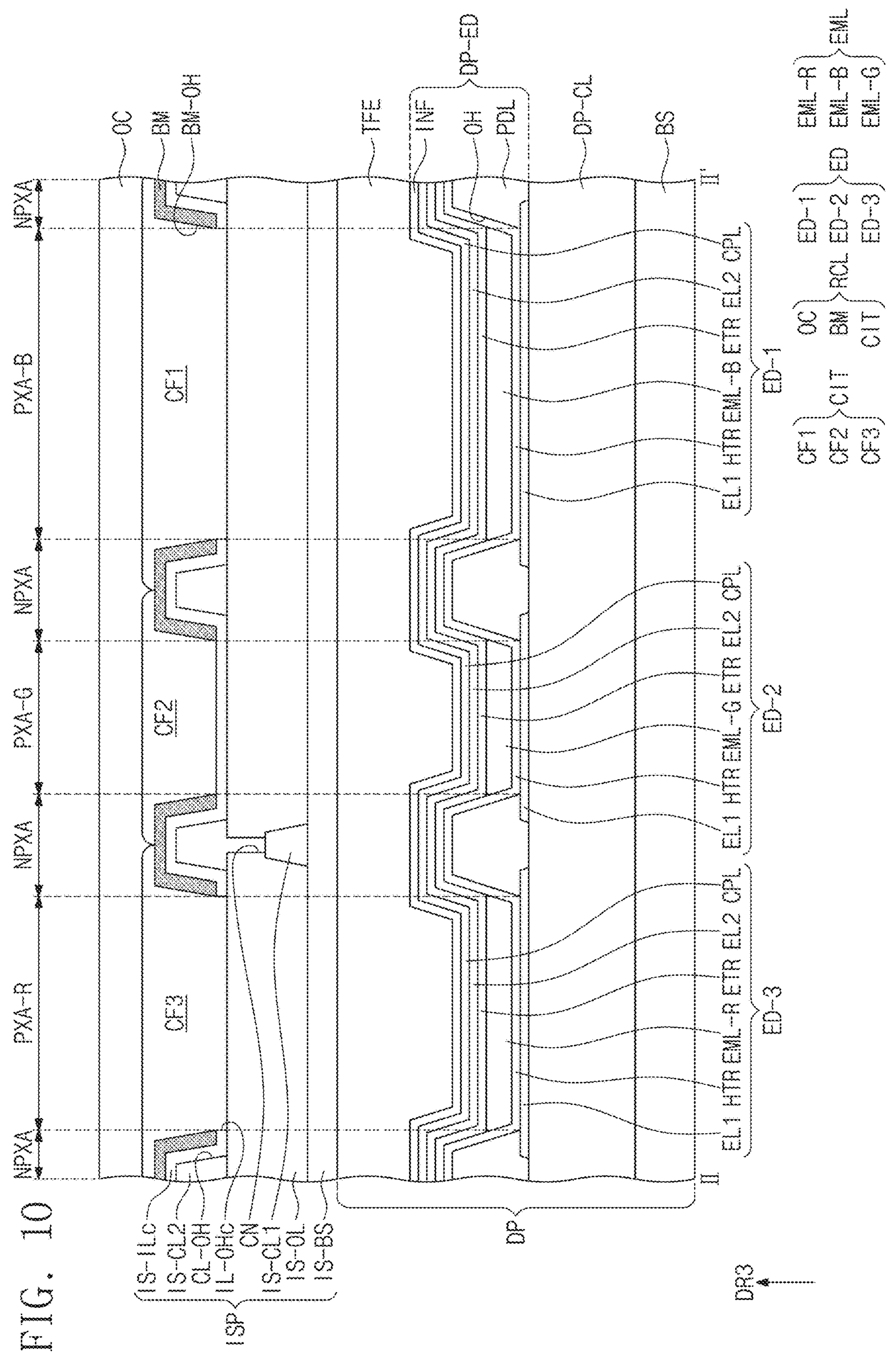
FIG. 10 is a cross-sectional view illustrating a portion of a display device according to an embodiment of the present inventive concept.

FIG. 10 is a cross-sectional view illustrating an embodiment of the present inventive concept, and is different in that the opening IL-OHc does not overlap any one of the first to third emission layers EML-B, EML-G, and EML-R compared to FIG. 5. In other words, one of the first to third emission layers EML-B, EML-G, and EML-R is not overlapped by the opening IL-OHc. To provide descriptions with reference to FIG. 10, descriptions that overlap with the descriptions provided with reference to FIGS. 1 to 9 will not be provided, and differences will be mainly described.

Referring to FIG. 10, the opening IL-OHc may overlap the first emission layer EML-B and the third emission layer EML-R and not overlap the second emission layer EML-G. For example, there are two of the openings IL-OHc are provided to respectively overlap the first emission layer EML-B and the third emission layer EML-R, and there is no opening IL-OHc of the inorganic layer IS-ILc in the green light-emitting region PXA-G. Unlike the illustration, the opening IL-OHc may overlap the first emission layer EML-B and the second emission layer EML-G and not overlap the third emission layer EML-R. For example, there is no opening IL-OHc of the inorganic layer IS-ILc in the red light-emitting region PXA-R. Alternatively, the opening IL-OHc may overlap the second emission layer EML-G and the third emission layer EML-R and not overlap the first emission layer EML-B. For example, there is no opening IL-OHc of the inorganic layer IS-ILc in the blue light-emitting region PXA-B.

Figure 11:
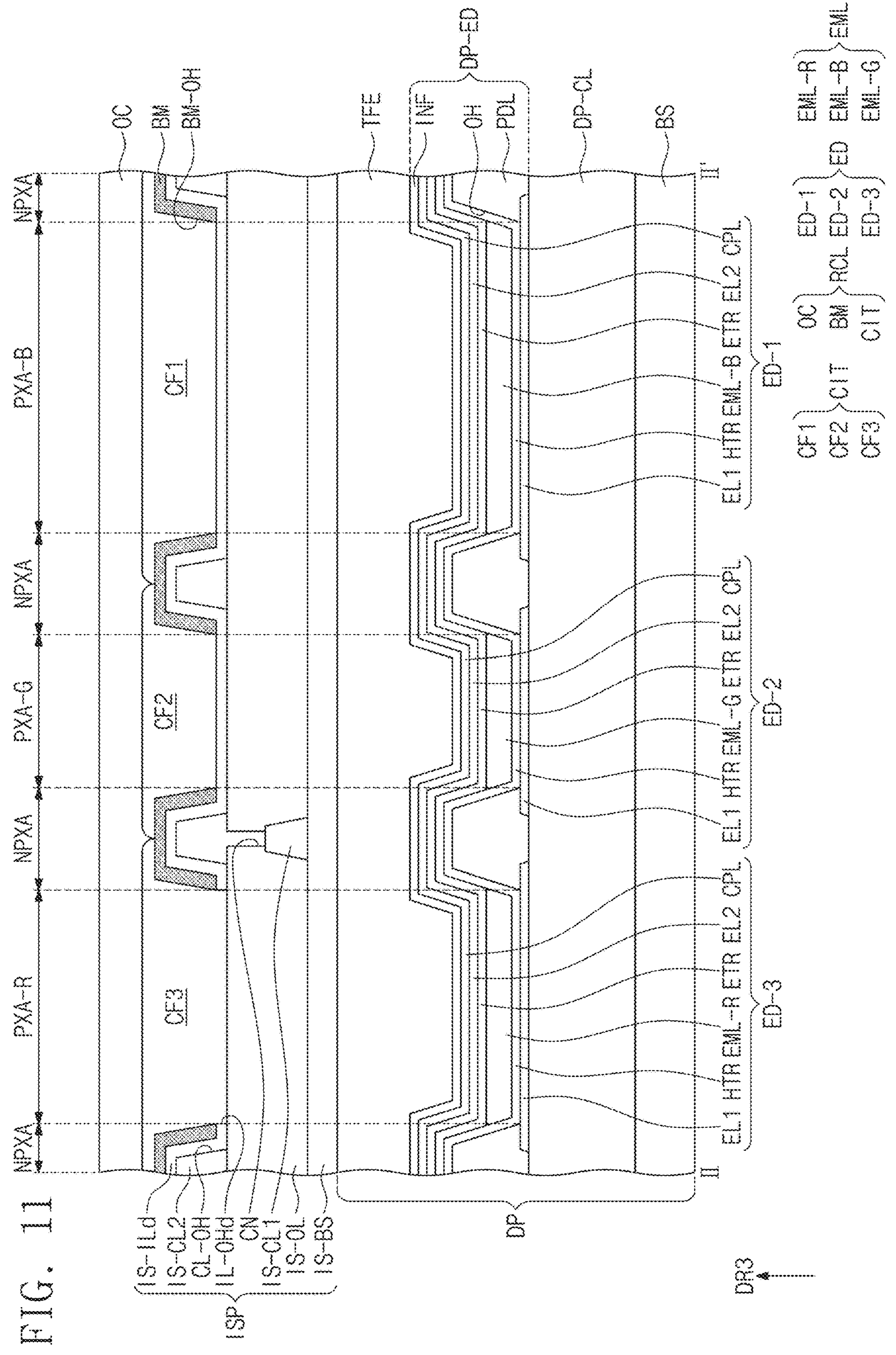
FIG. 11 is a cross-sectional view illustrating a portion of a display device according to an embodiment of the present inventive concept.

FIG. 11 is a cross-sectional view illustrating an embodiment of the present inventive concept, and is different in that the opening IL-OHd does not overlap any two of the first to third emission layers EML-B, EML-G, and EML-R compared to FIG. 5. In other words, two of the first to third emission layers EML-B, EML-G, and EML-R are not overlapped by the openings IL-OHc. To provide descriptions with reference to FIG. 11, descriptions that overlap with the descriptions provided with reference to FIGS. 1 to 10 will not be provided, and differences will be mainly described.

Referring to FIG. 11, the opening IL-OHd may overlap the third emission layer EML-R and not overlap the first emission layer EML-B and the second emission layer EML-G. For example, there is no opening IL-OHd of the inorganic layer IS-ILd in the blue and green light-emitting regions PXA-B and PXA-G. Unlike the illustration, the opening IL-OHd may overlap the second emission layer EML-G and not overlap the first emission layer EML-B and the third emission layer EML-R. For example, there is no opening IL-OHd of the inorganic layer IS-ILd in the blue and red light-emitting regions PXA-B and PXA-R. Alternatively, the opening IL-OHd may overlap the first emission layer EML-B and not overlap the second emission layer EML-G and the third emission layer EML-R. For example, there is no opening IL-OHd of the inorganic layer IS-ILd in the green and red light-emitting regions PXA-G and PXA-R.

Figure 12:
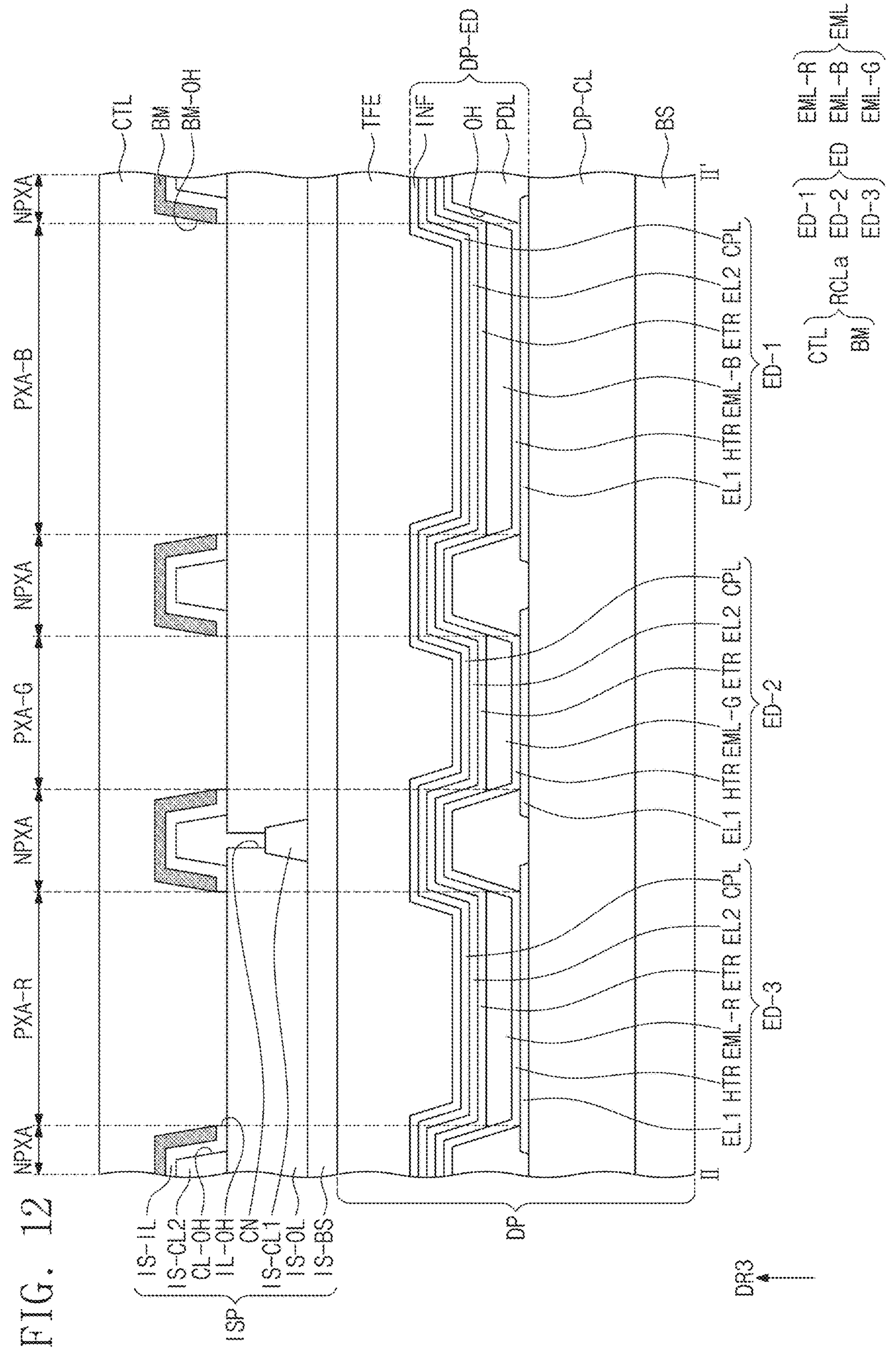
FIG. 12 is a cross-sectional view illustrating a portion of a display device according to an embodiment of the present inventive concept.

FIG. 12 is a cross-sectional view illustrating an embodiment of the present inventive concept, and is different in that the optical layer RCLa includes an optical control layer CTL instead of the filter part CIT compared to FIG. 5. To provide descriptions with reference to FIG. 12, descriptions that overlap with the descriptions provided with reference to FIGS. 1 to 11 will not be provided, and differences will be mainly described.

The optical control layer CTL may entirely overlap the display element layer DP-ED. The optical control layer CTL may be a planarization layer. The optical control layer CTL may be a layer that selectively transmits light emitted from the display panel DP. The optical control layer CTL may include a pigment or dye. The pigment and dye included in the optical control layer CTL may be a material that transmits only light of a particular wavelength region among light emitted from the display element layer DP-ED. Accordingly, the optical layer RCLa including the optical control layer CTL may enhance the display quality and light efficiency of the display device DD.

Figure 13:
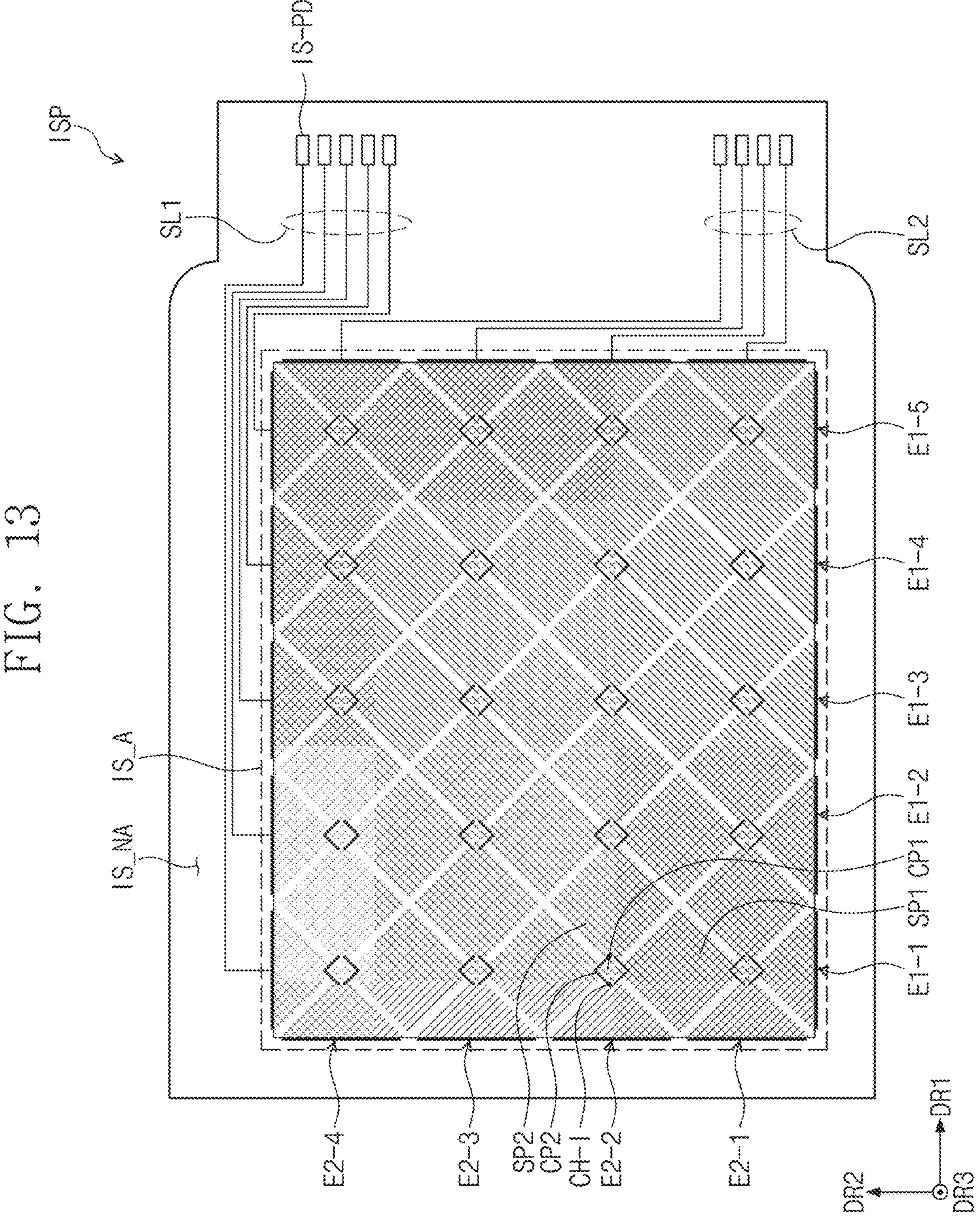
FIG. 13 is a plan view illustrating a portion of a display device according to an embodiment of the present inventive concept.

FIG. 13 is a plan view illustrating an input sensing layer according to an embodiment of the present inventive concept. Referring to FIG. 13, the input sensing layer ISP may be divided into a sensing region IS_A and a non-sensing region IS_NA adjacent to the sensing region IS_A. The non-sensing region IS_NA may surround the sensing region IS_A. The sensing region IS_A and the non-sensing region IS_NA may respectively correspond to the display region DD-DA and the non-display region DD-NDA illustrated in FIG. 1.

The input sensing layer ISP may include first sensing electrodes E1-1 to E1-5 and second sensing electrodes E2-1 to E2-4. The first sensing electrodes E1-1 to E1-5 may be arranged to be spaced apart from each other in the first direction DR1 and may extend in the second direction DR2. The second sensing electrodes E2-1 to E2-4 may be arranged to be spaced apart from each other in the second direction DR2 and may extend in the first direction DR1. The first sensing electrodes E1-1 to E1-5 and the second sensing electrodes E2-1 to E2-4 may be arranged in the sensing region IS_A and insulatively intersect each other.

The input sensing layer ISP may include first signal lines SL1 arranged in the non-sensing region IS_NA and electrically connected to the first sensing electrodes E1-1 to E1-5 and second signal lines SL2 electrically connected to the second sensing electrodes E2-1 to E2-4. The first sensing electrodes E1-1 to E1-5, the second sensing electrodes E2-1 to E2-4, the first signal lines SL1, and the second signal lines SL2 may be defined as the first conductive pattern layer IS-CL1, the second conductive pattern layer IS-CL2, or a combination of the first conductive pattern layer IS-CL1 and the second conductive pattern layer IS-CL2 described with reference to FIG. 5. Since the second sensing electrodes E2-1 to E2-4 are longer than the first sensing electrodes E1-1 to E1-5, a voltage drop of a detection signal (or a transmission signal) occurs and thus sensing sensitivity may be reduced. According to an embodiment of the present inventive concept, unlike shown in FIG. 13, a detection signal (or a transmission signal) is provided through the second signal lines SL2 connected to two opposite ends of the second sensing electrodes E2-1 to E2-4, a voltage drop of a detection signal (or a transmission signal) may be prevented and thus reduction of sensing sensitivity may be prevented.

The first sensing electrodes E1-1 to E1-5 and the second sensing electrodes E2-1 to E2-4 each may include a plurality of conductive lines intersecting each other. The plurality of conductive lines may define a plurality of openings, and the first sensing electrodes E1-1 to E1-5 and the second sensing electrodes E2-1 to E2-4 each may have a mesh shape. Each of the plurality of openings may be defined like the conductive opening CL-OH illustrated in FIG. 5. Since the first sensing electrodes E1-1 to E1-5 and the second sensing electrodes E2-1 to E2-4 do not overlap emission areas PXA (see FIG. 5), the first sensing electrodes E1-1 to E1-5 and the second sensing electrodes E2-1 to E2-4 may not be viewed by a user of the display device DD.

Either the first sensing electrodes E1-1 to E1-5 or the second sensing electrodes E2-1 to E2-4 may have an integrated shape. The first sensing electrodes E1-1 to E1-5 may include first sensing patterns SP1 and intermediate parts CP1. Two first sensing patterns SP1 disposed at opposite ends of one column of the first sensing electrodes E1-1 to E1-5 may each be smaller in size than each of first sensing patterns SP1 disposed at the center, for example, may each have a size corresponding to half a size of each of the first sensing patterns SP1 disposed at the center. Portion of the second conductive pattern layer IS-CL2 described above may correspond to the first sensing electrodes E1-1 to E1-5.

The second sensing electrodes E2-1 to E2-4 may include second sensing patterns SP2 and bridge patterns (or connection patterns) CP2. Two adjacent second sensing patterns SP2 may be connected to two bridge patterns CP2 through the contact hole CN penetrating the organic layer IS-OL (FIG. 5), but the number of bridge patterns is not limited. Two second sensing patterns SP2 disposed at opposite ends of one row of the second sensing electrodes E2-1 to E2-4 may each be smaller in size than each of second sensing patterns SP2 disposed at the center, for example, may each have a size corresponding to half a size of each of the second sensing patterns SP2 disposed at the center. Portion of the second conductive pattern layer IS-CL2 may correspond to the second sensing patterns SP2. Portion of the first conductive pattern layer IS-CL1 described above may correspond to the bridge patterns CP2.

Although it has been described that the bridge patterns CP2 are formed from the first conductive pattern layer IS-CL1 illustrated in FIG. 5 and the first sensing electrodes E1-1 to E1-5 and the second sensing patterns SP2 are formed from the second conductive pattern layer IS-CL2, the present inventive concept is not limited thereto. The first sensing electrodes E1-1 to E1-5 and the second sensing patterns SP2 may be formed from the first conductive pattern layer IS-CL1 illustrated in FIG. 5, and the bridge patterns CP2 may be formed from the second conductive pattern layer IS-CL2.

One of the first signal lines SL1 and the second signal lines SL2 may deliver a transmission signal for sensing an external input from an external circuit, and the other may deliver, to the external circuit, a change in capacitance between the first sensing electrodes E1-1 to E1-5 and the second sensing electrodes E2-1 to E2-4 as a reception signal. The input sensing layer ISP may sense an external input based on a sensing result of change in mutual capacitance between the first sensing electrodes E1-1 to E1-5 and the second sensing electrodes E2-1 to E2-4, or may sense an external input based on a sensing result of change in self-capacitance of each of the first sensing electrodes E1-1 to E1-5 and the second sensing electrodes E2-1 to E2-4.

Portion of the second conductive pattern layer IS-CL2 may correspond to the first signal lines SL1 and the second signal lines SL2. The first signal lines SL1 and the second signal lines SL2 each may have a multi-layer structure, and may also include a first-layer line formed from the first conductive pattern layer IS-CL1 and a second-layer line formed from the second conductive pattern layer IS-CL2. The first-layer line and the second-layer line may be connected through a contact hole penetrating the organic layer IS-OL (FIG. 5).

When an input sensing layer is employed in medium and large-size display devices, an RC delay may increase since lengths of sensing electrodes and signal lines of the input sensing layer increase. Lowering both resistance and capacitance would be ideal to reduce RC delay. However, the costs of lowering capacitance are especially high for device manufacturers. Lowering resistance is therefore the preferred approach for scaling performance. To reduce such an RC delay, resistance of signal lines and sensing electrodes may be reduced. A thickness of a conductive pattern layer may be increased to reduce the resistance of signal lines and sensing electrodes. For example, the first conductive pattern layer IS-CL1 and the second conductive pattern layer IS-CL2 each may have a thickness of about at least 6000 Å. The signal lines SL1 and SL2 and the sensing electrodes E1-1 to E1-5 and E2-1 to E2-4 formed from the first conductive pattern layer IS-CL1 and the second conductive pattern layer IS-CL2 having a thickness of about at least 6000 Å may reduce the RC delay.

The input sensing layer ISP may include pad electrodes IS-PD connected to ends of the first signal lines SL1 and the second signal lines SL2 and disposed in the non-sensing region IS_NA. The above-mentioned inorganic layers IS-IL, IS-ILy, IS-ILa, IS-ILb, IS-ILc, and IS-ILd (FIGS. 5, 7C, and 8 to 12) may not overlap the pad electrodes IS-PD. The pad electrodes IS-PD may be electrically connected to a circuit board.

Figure 14:
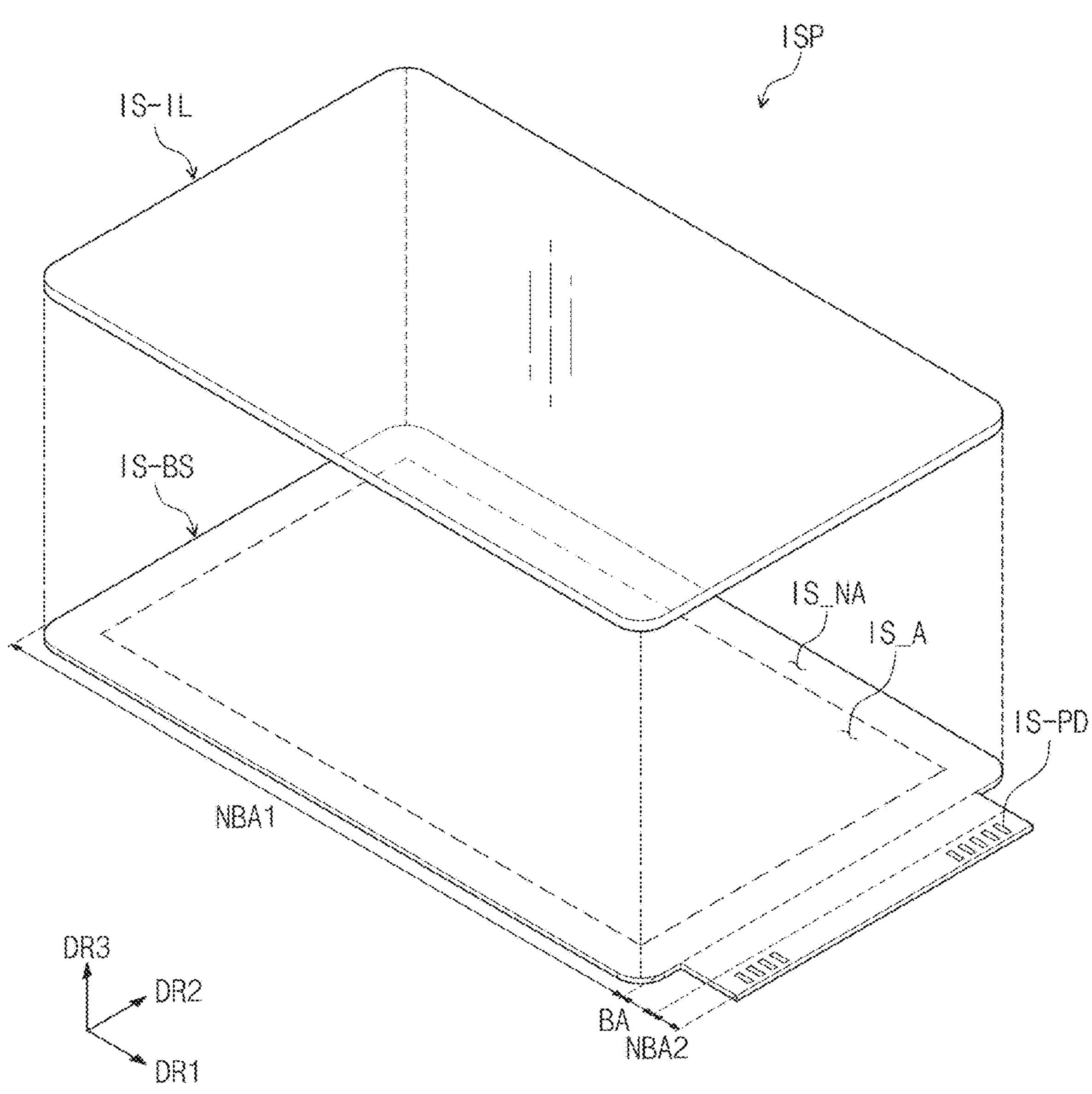
FIG. 14 is an exploded perspective view illustrating a portion of a display device according to an embodiment of the present inventive concept.

FIG. 14 is an exploded perspective view illustrating an input sensing layer according to an embodiment of the present inventive concept. For convenience, some selected components of the input sensing layer ISP are shown to schematically illustrate the input sensing layer ISP in FIG. 14.

Referring to FIG. 14, the inorganic layer IS-IL may overlap the first non-bending region NBA1 and may not overlap the bending region BA and the second non-bending region NBA2. In a state in which the bending region BA is bent, at least a portion of the second non-bending region NBA2 may overlap the first non-bending region NBA1. The pad electrodes IS-PD may be arranged in the second non-bending region NBA2. The inorganic layer IS-IL may not overlap the pad electrodes IS-PD connected to ends of the first signal lines SL1 (FIG. 13) and ends of the second signal lines SL2 (FIG. 13). The pad electrodes IS-PD may be electrically connected to a circuit board.

Figure 15:
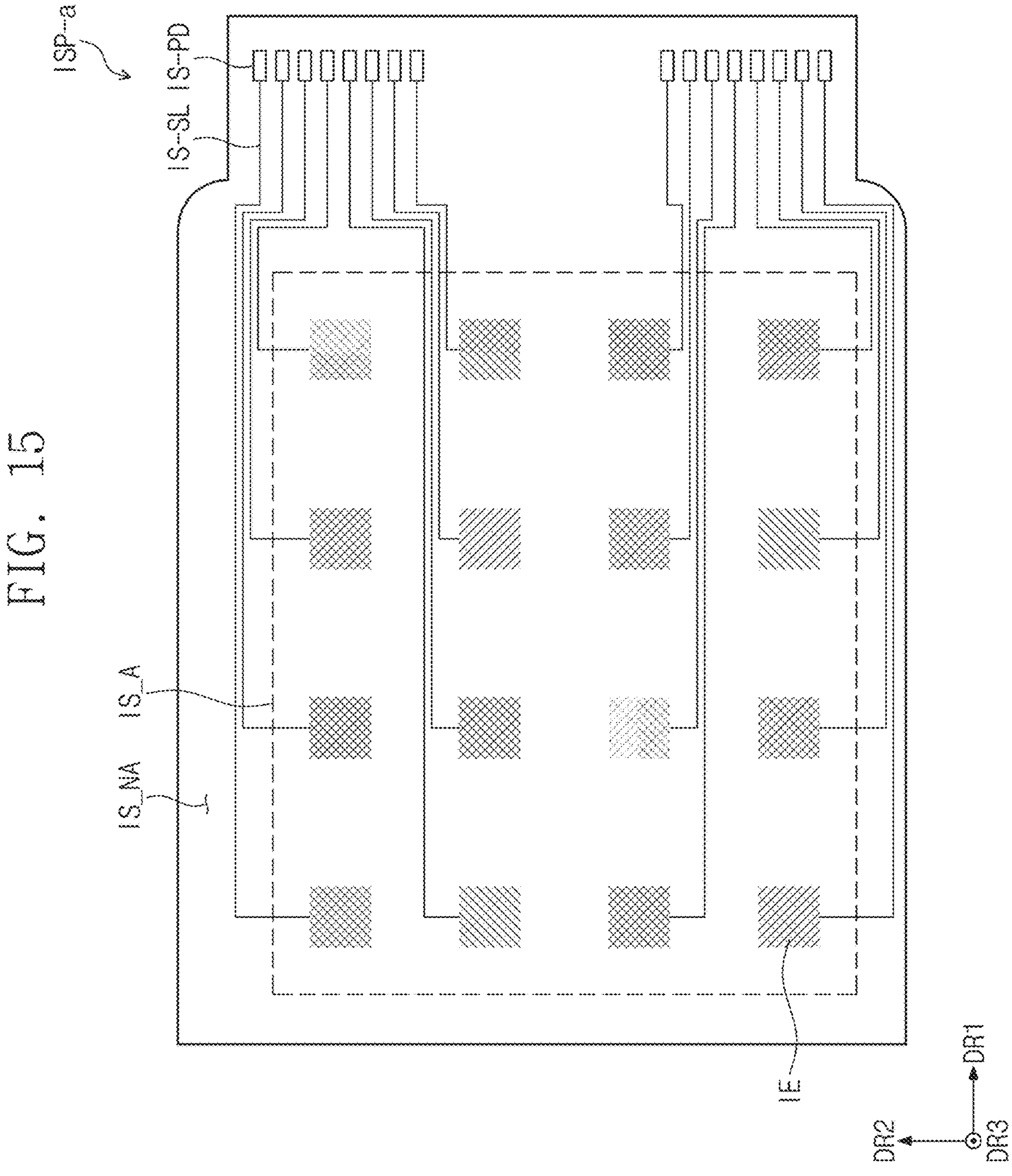
FIG. 15 is a plan view illustrating a portion of a display device according to an embodiment of the present inventive concept.

FIG. 15 is a plan view illustrating an input sensing layer according to an embodiment of the present inventive concept. FIG. 16 is a cross-sectional view illustrating a display device according to an embodiment of the present inventive concept. To provide descriptions with reference to FIGS. 15 and 16, descriptions that overlap with the descriptions provided with reference to FIGS. 1 to 14 will not be provided, and differences will be mainly described.

Referring to FIG. 15, an input sensing layer ISP-a may include sensing electrodes IE, signal lines IS-SL electrically connected to the sensing electrodes IE, and the pad electrodes IS-PD connected to ends of the signal lines IS-SL. Referring to FIG. 15, a portion of each of the signal lines IS-SL may be arranged in the sensing region IS_A, and another portion other than the portion may be arranged in the non-sensing region IS_NA. That is, a portion of any one of the signal lines IS-SL may be arranged in the sensing region IS_A, and another portion other than the portion arranged in the sensing region IS_A may be arranged in the non-sensing region IS_NA.

Compared to the input sensing layer ISP illustrated in FIG. 14, the input sensing layer ISP-a illustrated in FIG. 15 is different in that the input sensing layer ISP-a does not include a bridge pattern, and a portion of each of the signal lines IS-SL is arranged in the sensing region IS_A. The sensing electrodes IE may include a plurality of sensing electrode rows extending in the first direction DR1 and arranged in the second direction DR2, and a plurality of sensing electrode columns extending in the second direction DR2 and arranged in the first direction DR1. In an embodiment of the present inventive concept, the plurality of sensing electrodes IE may be arranged in a matrix structure. However, the present inventive concept is not limited thereto. The sensing electrodes IE illustrated in FIG. 15 each may have unique coordinate information. The input sensing layer ISP-a illustrated in FIG. 15 may obtain coordinate information in a self-capacitance manner The sensing electrodes IE each may have a mesh shape.

FIG. 16 is a cross-sectional view illustrating a display device including the input sensing layer ISP-a illustrated in FIG. 15. Compared to the input sensing layer ISP illustrated in FIG. 5, the input sensing layer ISP-a illustrated in FIG. 16 is different in that the input sensing layer ISP-a includes only one conductive pattern layer IS-CL. Furthermore, the input sensing layer ISP-a of FIG. 16 may not include the base insulating layer IS-BS (FIG. 5).

Referring to FIG. 16, the input sensing layer ISP-a may include the organic layer IS-OL, the conductive pattern layer IS-CL, and the inorganic layer IS-IL. The organic layer IS-OL may be arranged on the encapsulation layer TFE, and the conductive pattern layer IS-CL may be arranged between the organic layer IS-OL and the inorganic layer IS-IL. There is no conductive pattern layer IS-CL formed in the organic layer. Although FIG. 16 illustrates that the opening IL-OH of the inorganic layer IS-IL overlaps all of the first to third emission layers EML-B, EML-G, and EML-R, the present inventive concept is not limited thereto. The descriptions provided above with reference to FIGS. 5 to 12 may apply to the inorganic layer IS-IL arranged on the conductive pattern layer IS-CL of FIG. 16.

FIGS. 17 to 29 are diagrams schematically illustrating a method of manufacturing a display device according to an embodiment of the present inventive concept. To provide descriptions with reference to FIGS. 17 to 29, descriptions that overlap with the descriptions provided with reference to FIGS. 1 to 16 will not be provided, and differences will be mainly described.

Figure 17:
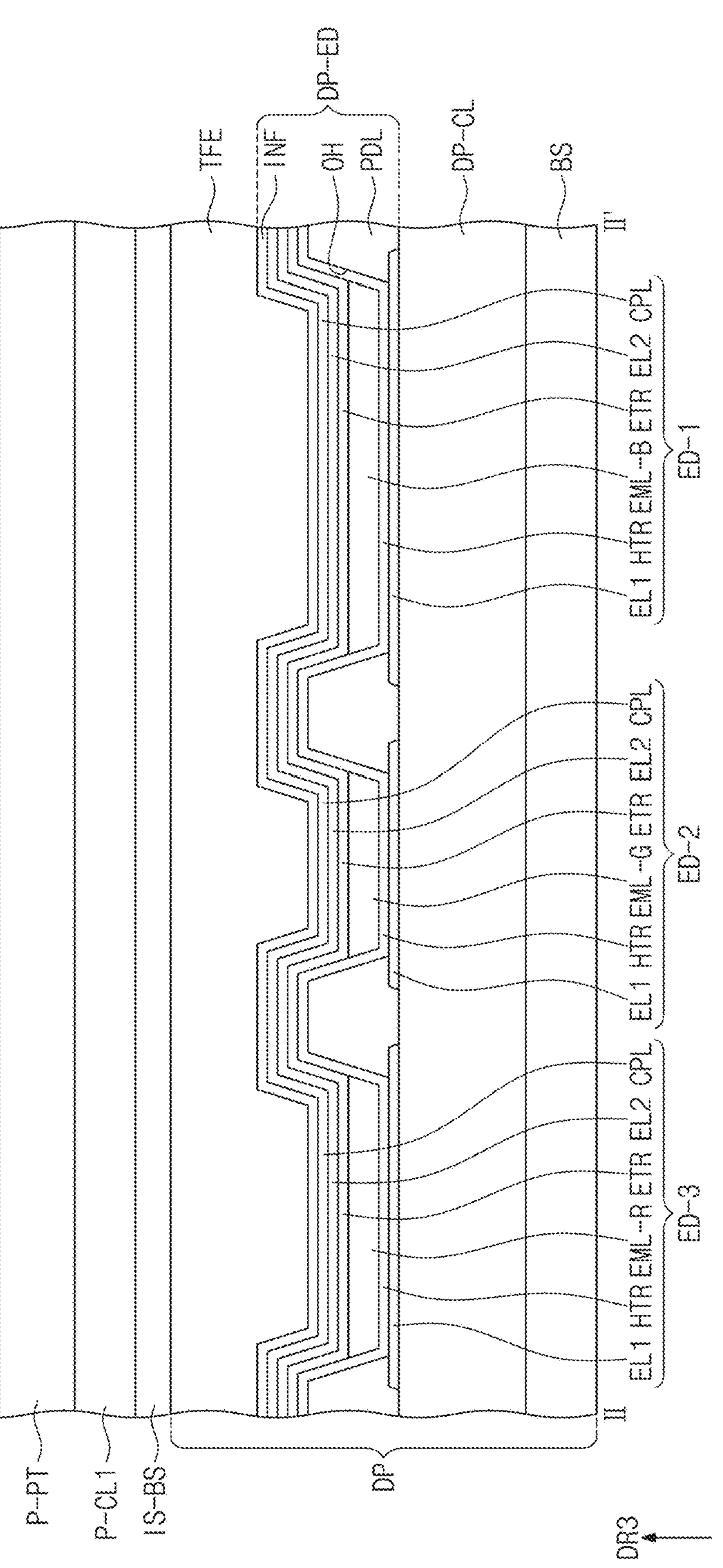
FIG. 17 is a diagram schematically illustrating a process of manufacturing a display device according to an embodiment of the present inventive concept.

Referring to FIG. 17, the base insulating layer IS-BS may be formed on the encapsulation layer TFE, and a preliminary first conductive pattern layer P-CL1 may be formed on the base insulating layer IS-BS. The preliminary first conductive pattern layer P-CL1 may be formed of a metal and/or transparent conductive material. A photosensitive film P-PT may be provided on the preliminary first conductive pattern layer P-CL1.

Figure 18:
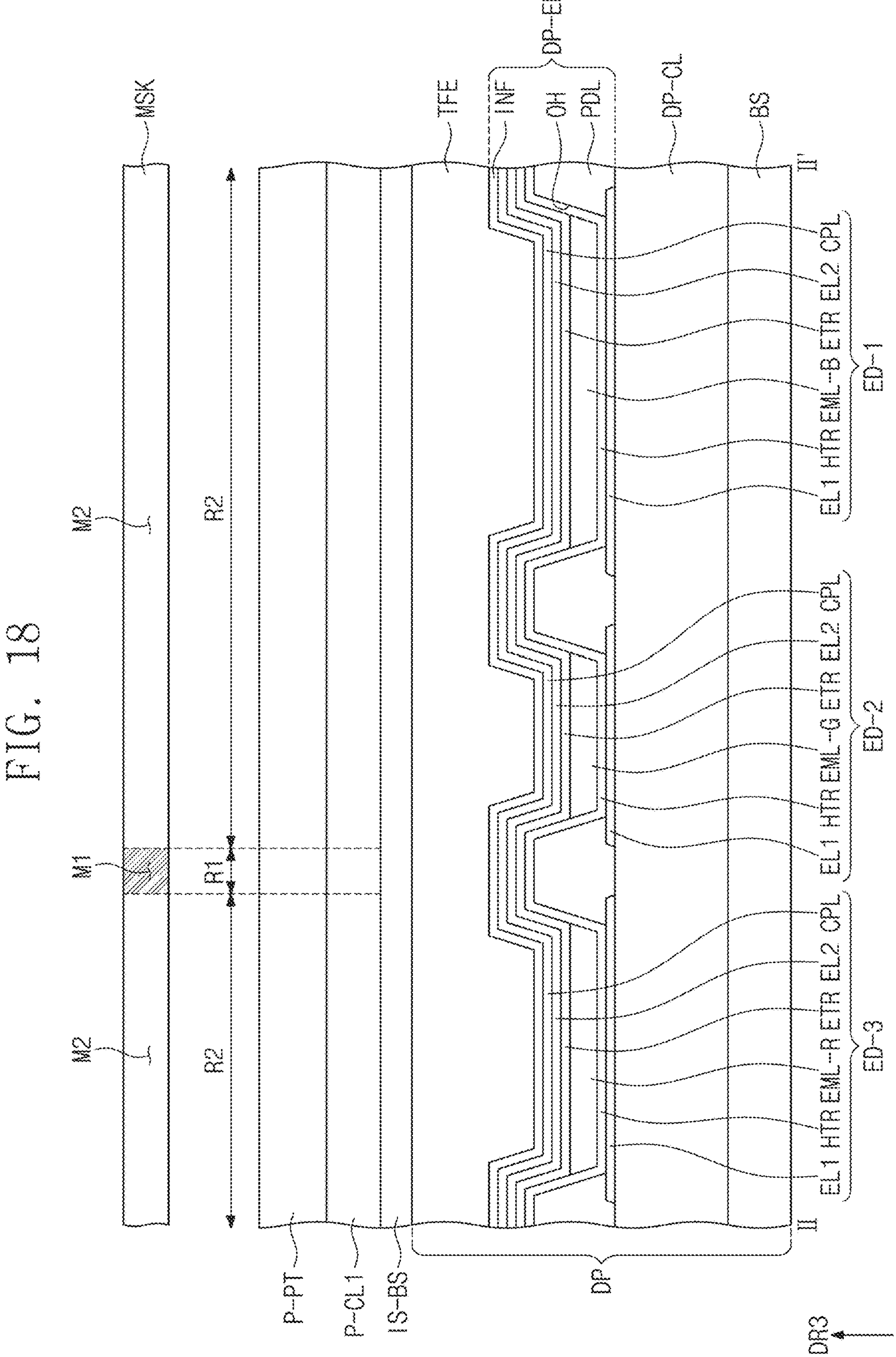
FIG. 18 is a diagram schematically illustrating a process of manufacturing a display device according to an embodiment of the present inventive concept.
Figure 19:
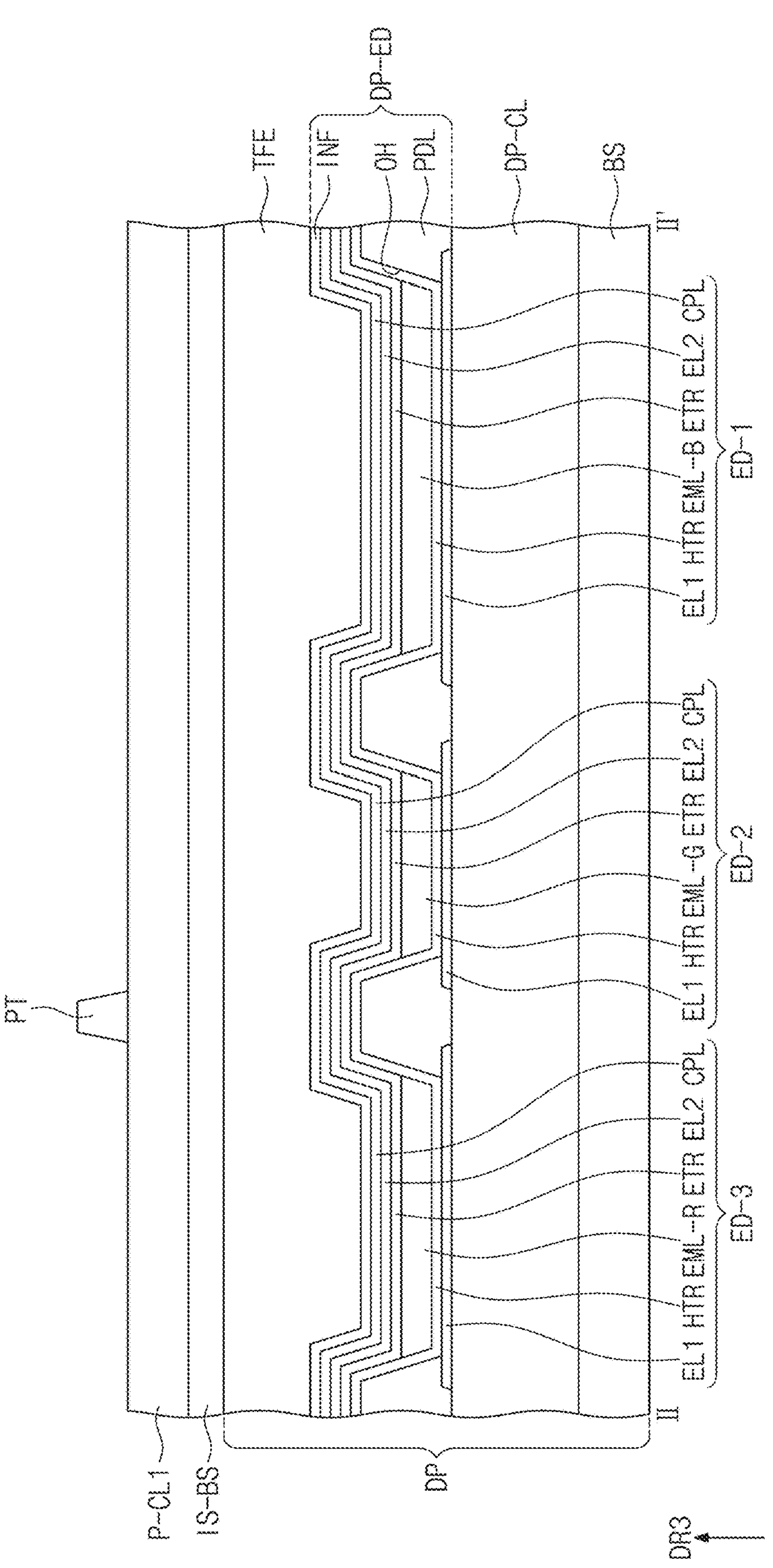
FIG. 19 is a diagram schematically illustrating a process of manufacturing a display device according to an embodiment of the present inventive concept.

Referring to FIGS. 18 and 19, the photosensitive film P-PT may be exposed through a mask MSK. The mask MSK may include a first part M1 that blocks entire irradiated light and a second part M2 that partially transmits and partially blocks the light. The preliminary first conductive pattern layer P-CL1 may be divided into a first region R1 corresponding to the first part M1 and a second region R2 corresponding to the second part M2.

Thereafter, when the photosensitive film P-PT exposed through the mask MSK has been developed, a photosensitive film pattern PT having a predetermined thickness remains in the first region R1 in which light has not been provided by being blocked by the mask MSK. The photosensitive film P-PT is completely removed in the second region R2 in which light transmitted through the second part M2 of the mask MSK has been provided so that a surface of the preliminary first conductive pattern layer P-CL1 may be exposed, as illustrated in FIG. 19. Although FIGS. 18 and 19 illustrate an example in which positive photoresist is used so as to remove an exposed portion of a photosensitive film, the present inventive concept is not limited thereto. In an embodiment of the present inventive concept, negative photoresist may be used so as to remove a non-exposed portion of a photosensitive film. To form the photosensitive film pattern PT using a negative photoresist, the mask MSK may include a first part M1 that transmits the irradiated light and a second part M2 that blocks the entire irradiated light.

Figure 20:
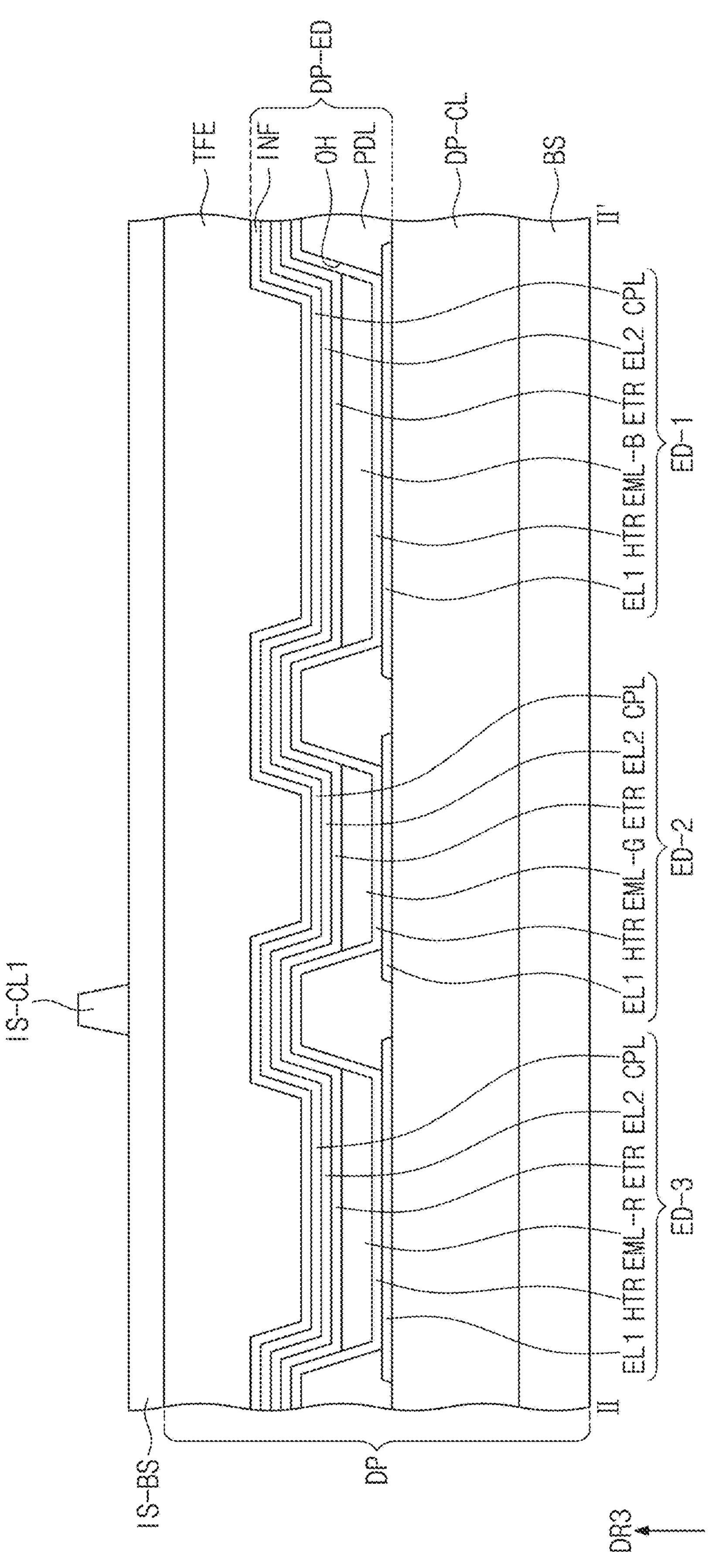
FIG. 20 is a diagram schematically illustrating a process of manufacturing a display device according to an embodiment of the present inventive concept.

The photosensitive film pattern PT may be used as a mask layer for etching the preliminary first conductive pattern layer P-CL1. The first region R1 of the preliminary first conductive pattern layer P-CL1 may not be etched since the photosensitive film pattern PT is formed in the first region R1, and the second region R2 of the preliminary first conductive pattern layer P-CL1 may be etched since the photosensitive film pattern PT is not formed in the second region R2 and a surface of the preliminary first conductive pattern layer P-CL1 in the second region R2 is exposed. Referring to FIGS. 19 and 20, the first conductive pattern layer IS-CL1 may be formed by etching the preliminary first conductive pattern layer P-CL1. For example, the first conductive pattern layer IS-CL1 may be formed through a dry etching process.

Figure 21:
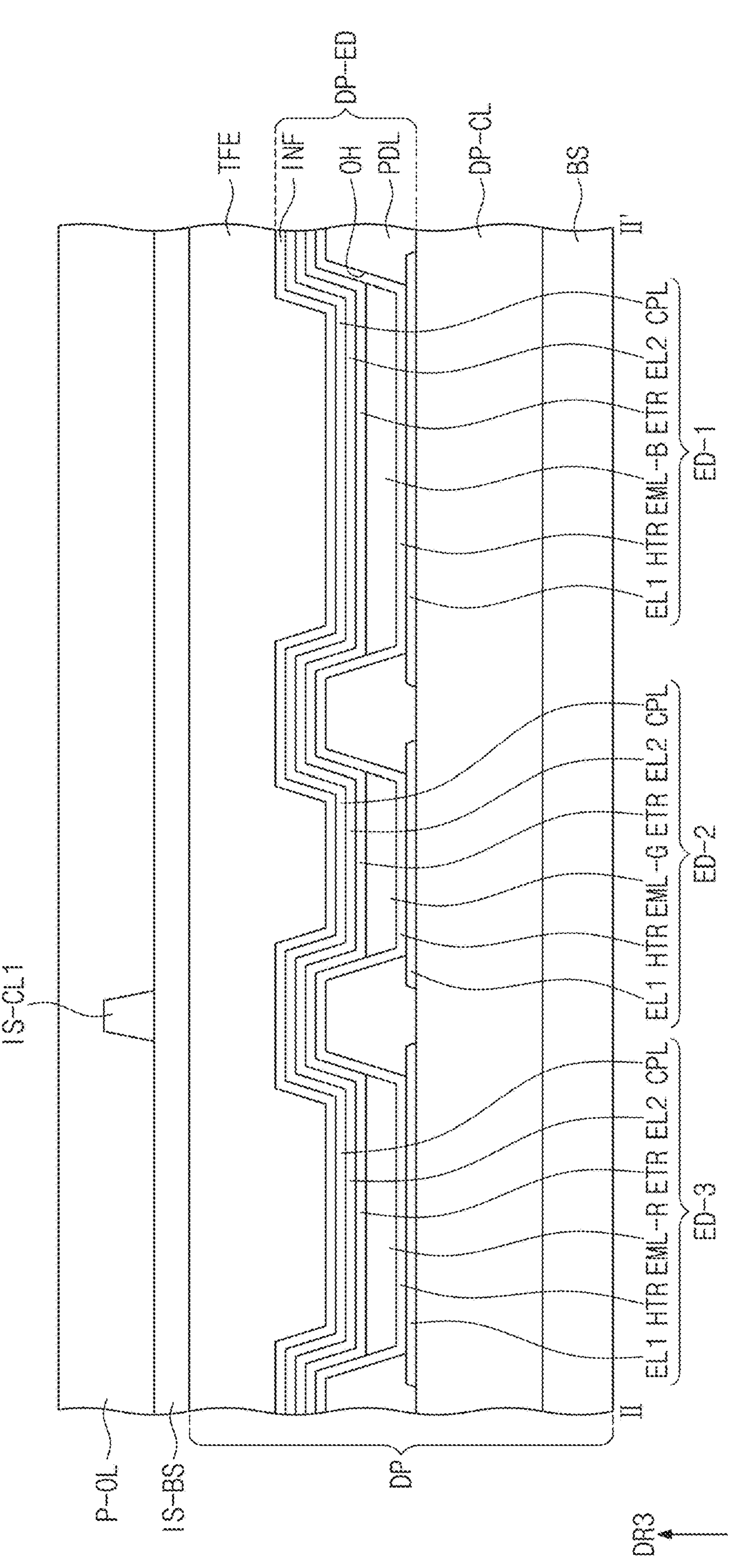
FIG. 21 is a diagram schematically illustrating a process of manufacturing a display device according to an embodiment of the present inventive concept.

Referring to FIG. 21, a preliminary organic layer P-OL may be provided on the first conductive pattern layer IS-CL1. The preliminary organic layer P-OL may cover the first conductive pattern layer IS-CL1. The preliminary organic layer P-OL may be formed by coating an organic material. The preliminary organic layer P-OL including an organic material may be formed via a solution process such as, for example, spin coating, slit coating, or inkjet process. The organic material may include at least one of, for example, acrylic resin, methacrylic resin, polyisoprene, vinyl-based resin, epoxy-based resin, urethane-based resin, cellulosic resin, siloxane-based resin, polyimide-based resin, polyimide-based resin, or perylene-based resin.

Figure 22:
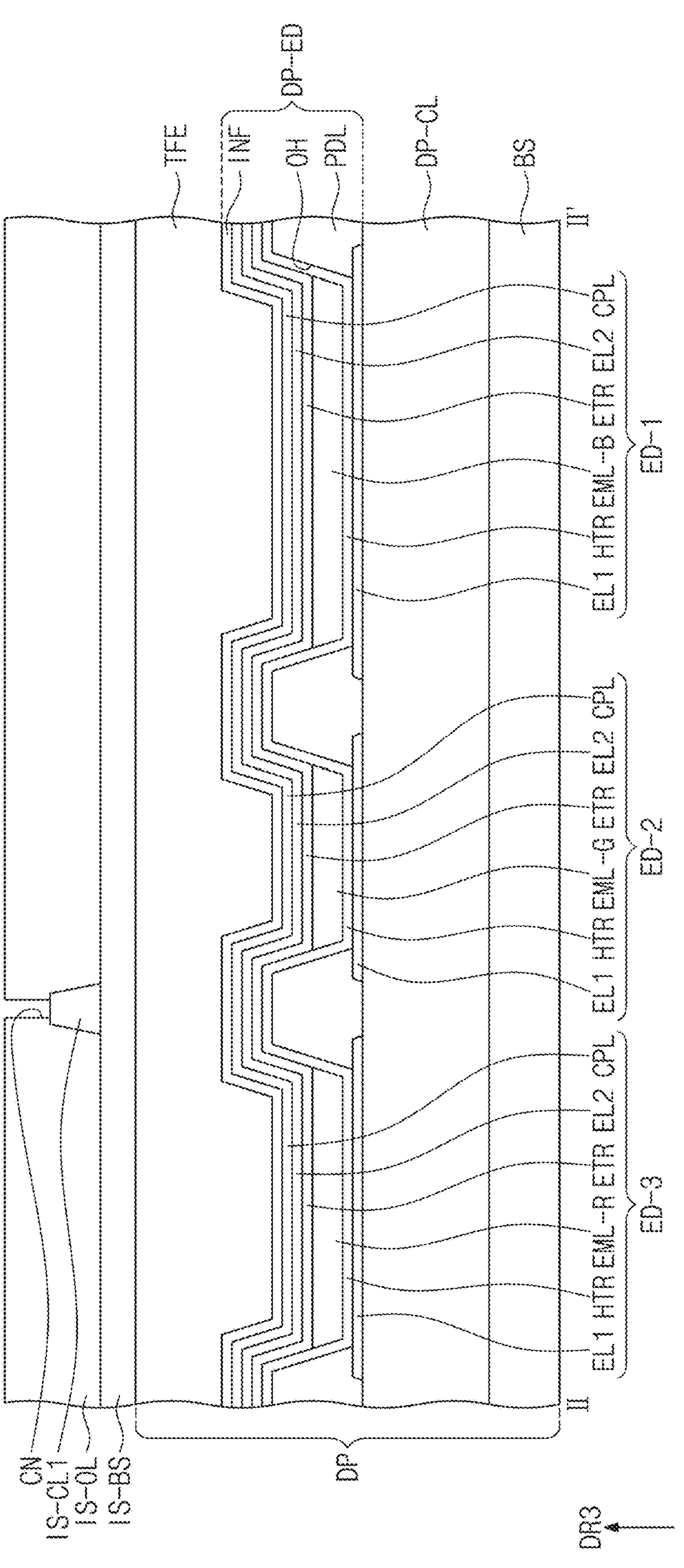
FIG. 22 is a diagram schematically illustrating a process of manufacturing a display device according to an embodiment of the present inventive concept.

Referring to FIGS. 21 and 22, the organic layer IS-OL may be formed from the preliminary organic layer P-OL. The contact hole CN may be formed in the organic layer IS-OL, and a material of a preliminary second conductive pattern layer P-CL2 may be provided in the contact hole CN.

Figure 23:
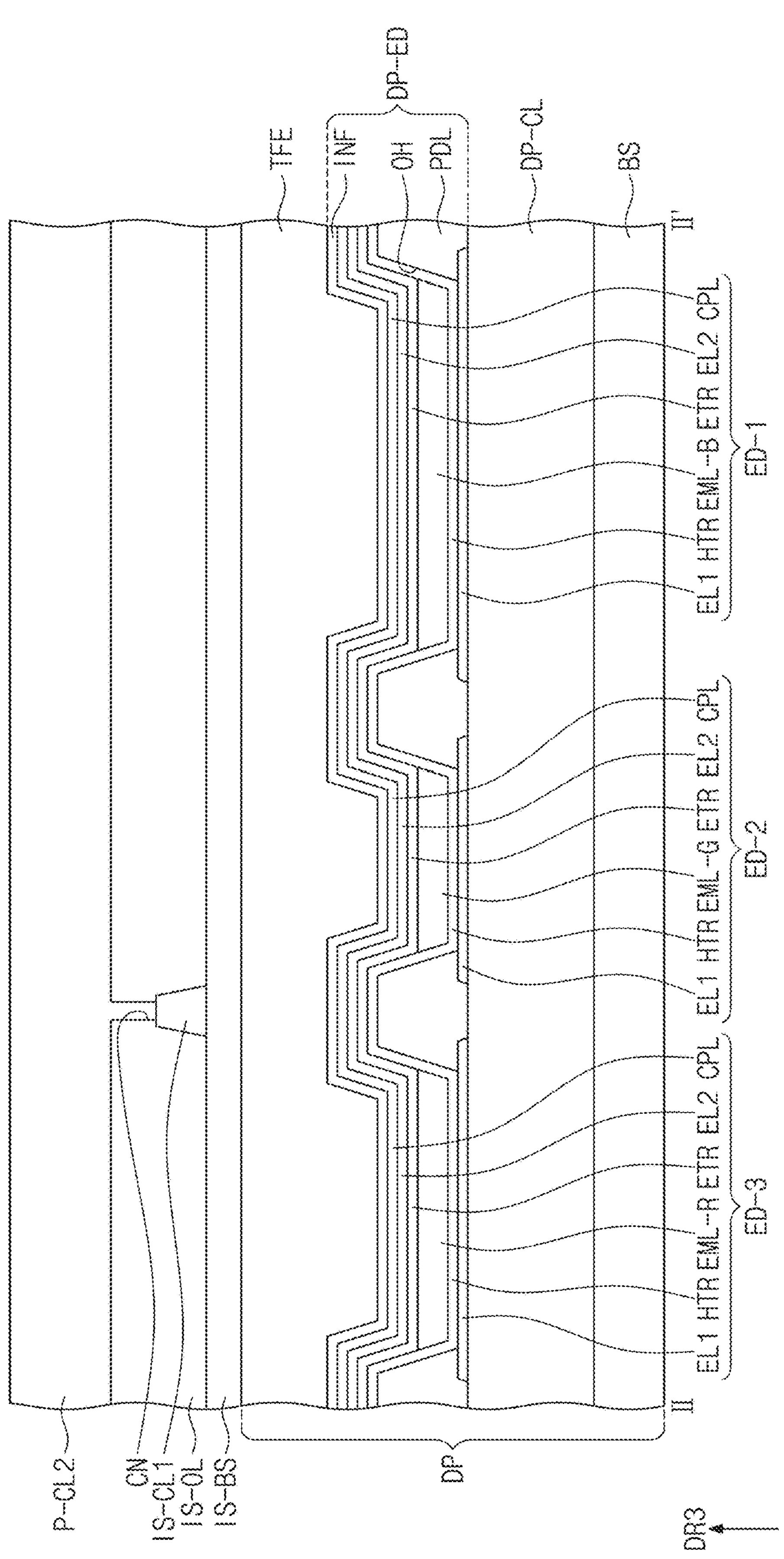
FIG. 23 is a diagram schematically illustrating a process of manufacturing a display device according to an embodiment of the present inventive concept.
Figure 24:
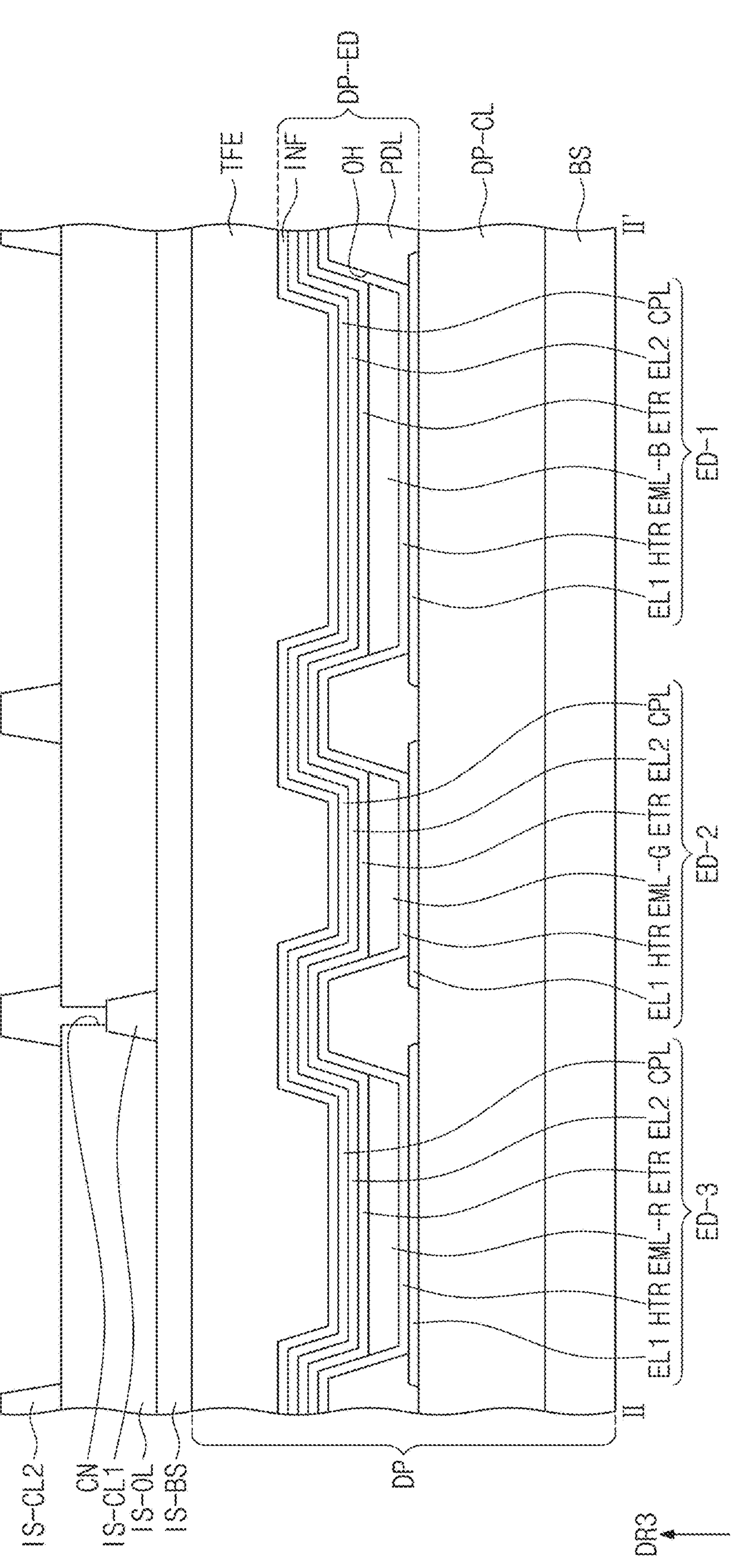
FIG. 24 is a diagram schematically illustrating a process of manufacturing a display device according to an embodiment of the present inventive concept.

Referring to FIG. 23, the preliminary second conductive pattern layer P-CL2 may be formed on the organic layer IS-OL. The preliminary second conductive pattern layer P-CL2 may be formed of a metal and/or transparent conductive material. Referring to FIGS. 23 and 24, the second conductive pattern layer IS-CL2 may be formed from the preliminary second conductive pattern layer P-CL2. The photosensitive film P-PT (FIG. 18) may be provided on the preliminary second conductive pattern layer P-CL2, and the photosensitive film pattern PT (FIG. 19) may be formed from the photosensitive film P-PT (FIG. 18). The second conductive pattern layer IS-CL2 may be formed from the preliminary second conductive pattern layer P-CL2 using the photosensitive film pattern PT (FIG. 19) as a mask layer for etching the preliminary second conductive pattern layer P-CL2. For example, the second conductive pattern layer IS-CL2 may be formed from the preliminary second conductive pattern layer P-CL2 through steps similar to the steps illustrated in FIGS. 18-20.

Figure 25:
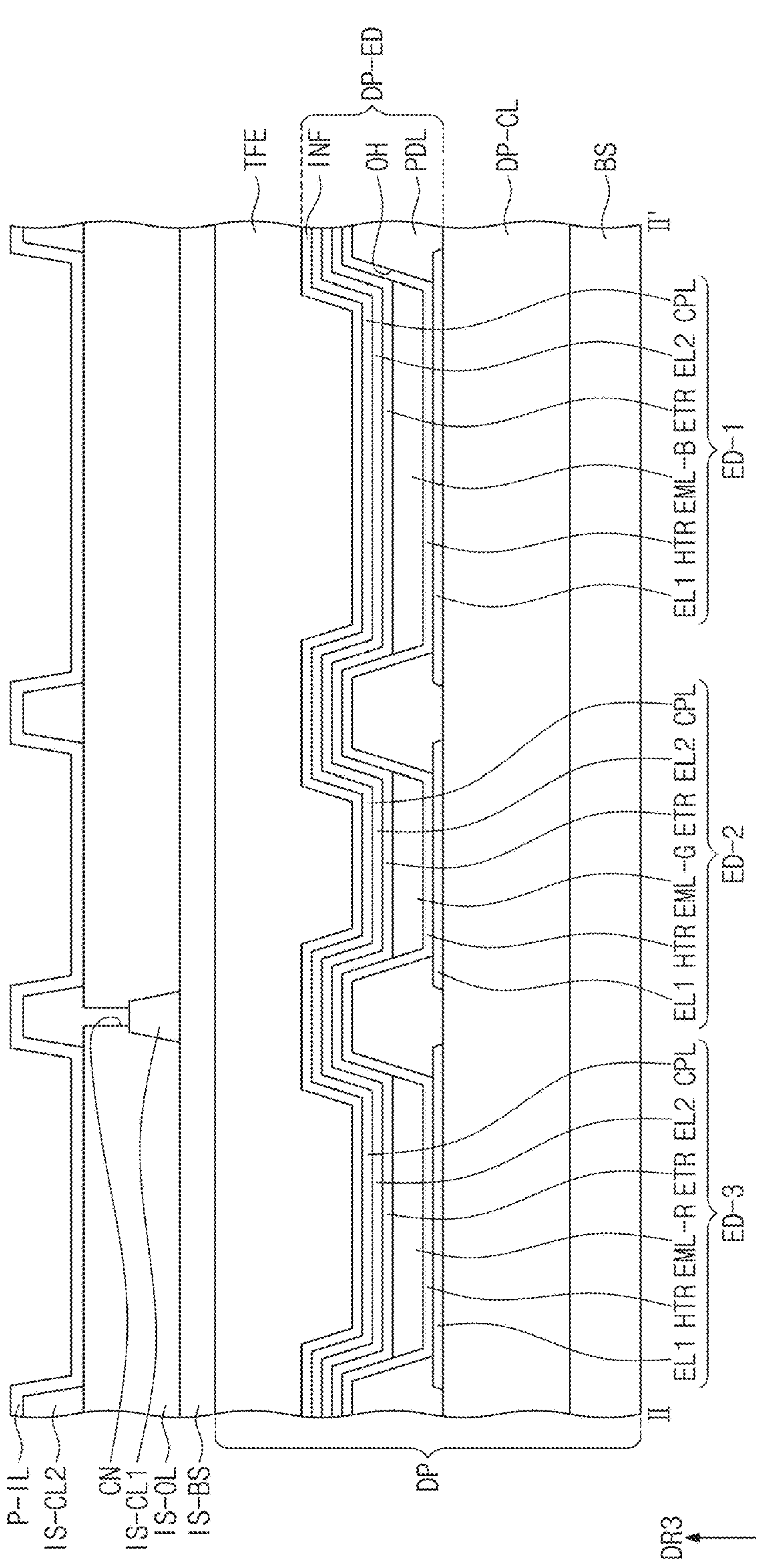
FIG. 25 is a diagram schematically illustrating a process of manufacturing a display device according to an embodiment of the present inventive concept.
Figure 26:
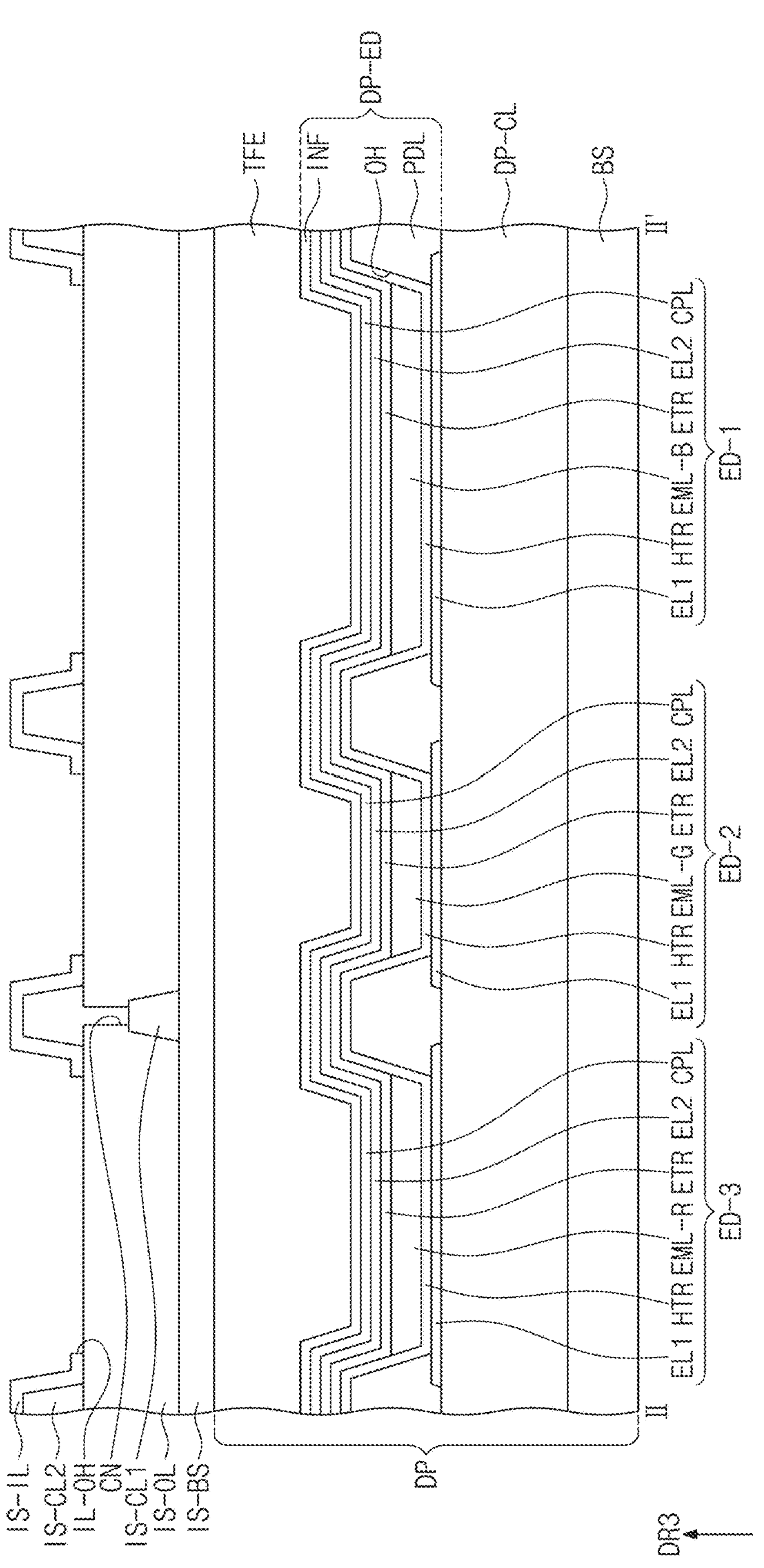
FIG. 26 is a diagram schematically illustrating a process of manufacturing a display device according to an embodiment of the present inventive concept.

Referring to FIG. 25, a preliminary inorganic layer P-IL may be formed on the second conductive pattern layer IS-CL2. For example, the preliminary inorganic layer P-IL may be formed through reactive sputtering or chemical vapor deposition (CVD). The preliminary inorganic layer P-IL may be formed conformally to cover the underlying features such as the second conductive pattern layer IS-CL2 and the organic layer IS-OL. The preliminary inorganic layer P-IL may be formed by providing an inorganic material. The inorganic material may include at least one of aluminum oxide ($Al_2O_3$), titanium oxide ($TiO_2$), silicon oxide ($SiO_x$), silicon oxynitride (SiON), zirconium oxide ($ZrO_2$), or hafnium oxide ($HfO_2$). Referring to FIGS. 25 and 26, the inorganic layer IS-IL may be formed from the preliminary inorganic layer P-IL. At least one opening IL-OH may be formed in the inorganic layer IS-IL. The at least one opening IL-OH of the inorganic layer IS-IL may overlap the pixel opening OH and may not overlap the first and second conductive pattern layers IS-CL1 and IS-CL2.

Figure 27:
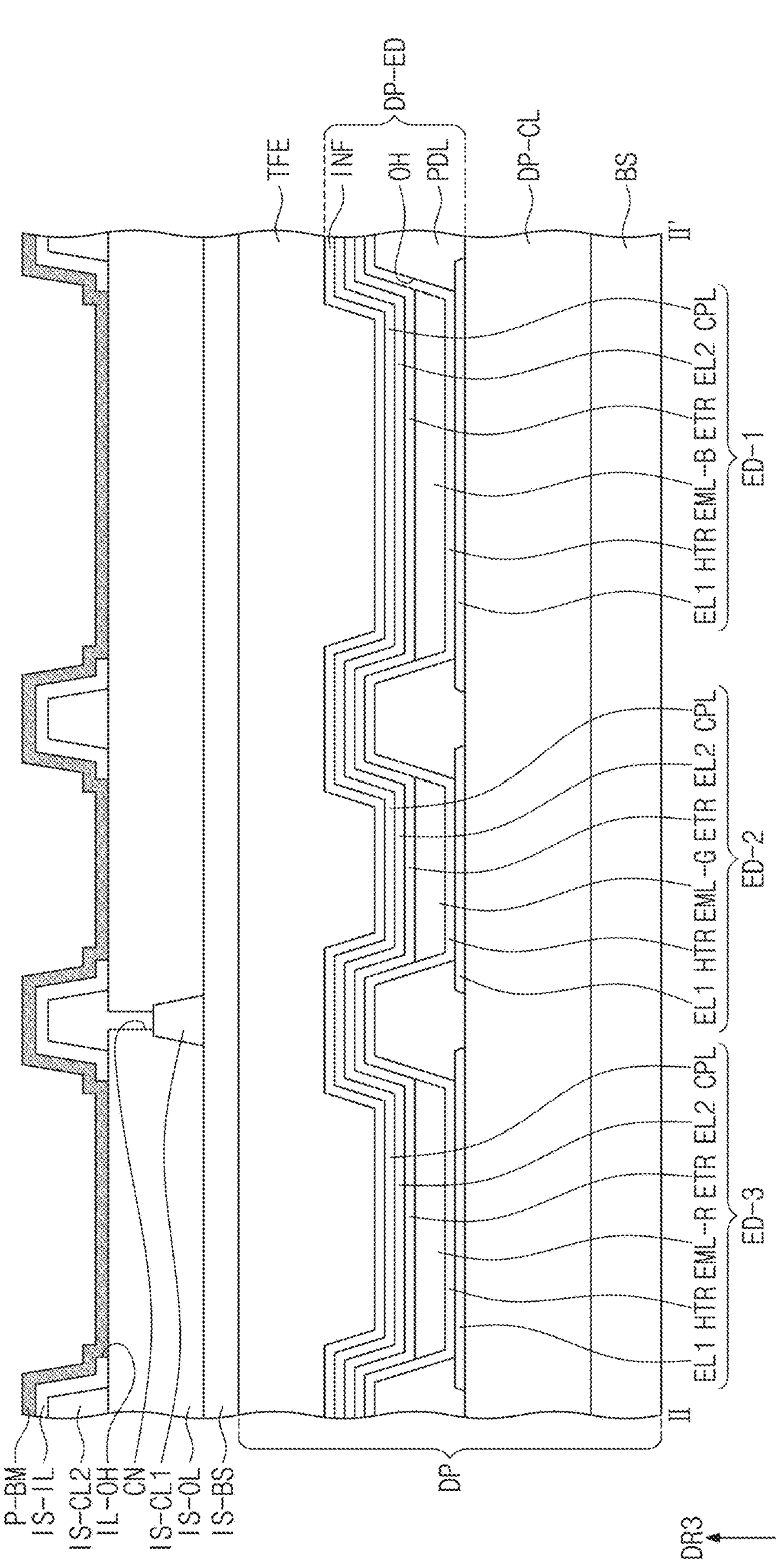
FIG. 27 is a diagram schematically illustrating a process of manufacturing a display device according to an embodiment of the present inventive concept.
Figure 28:
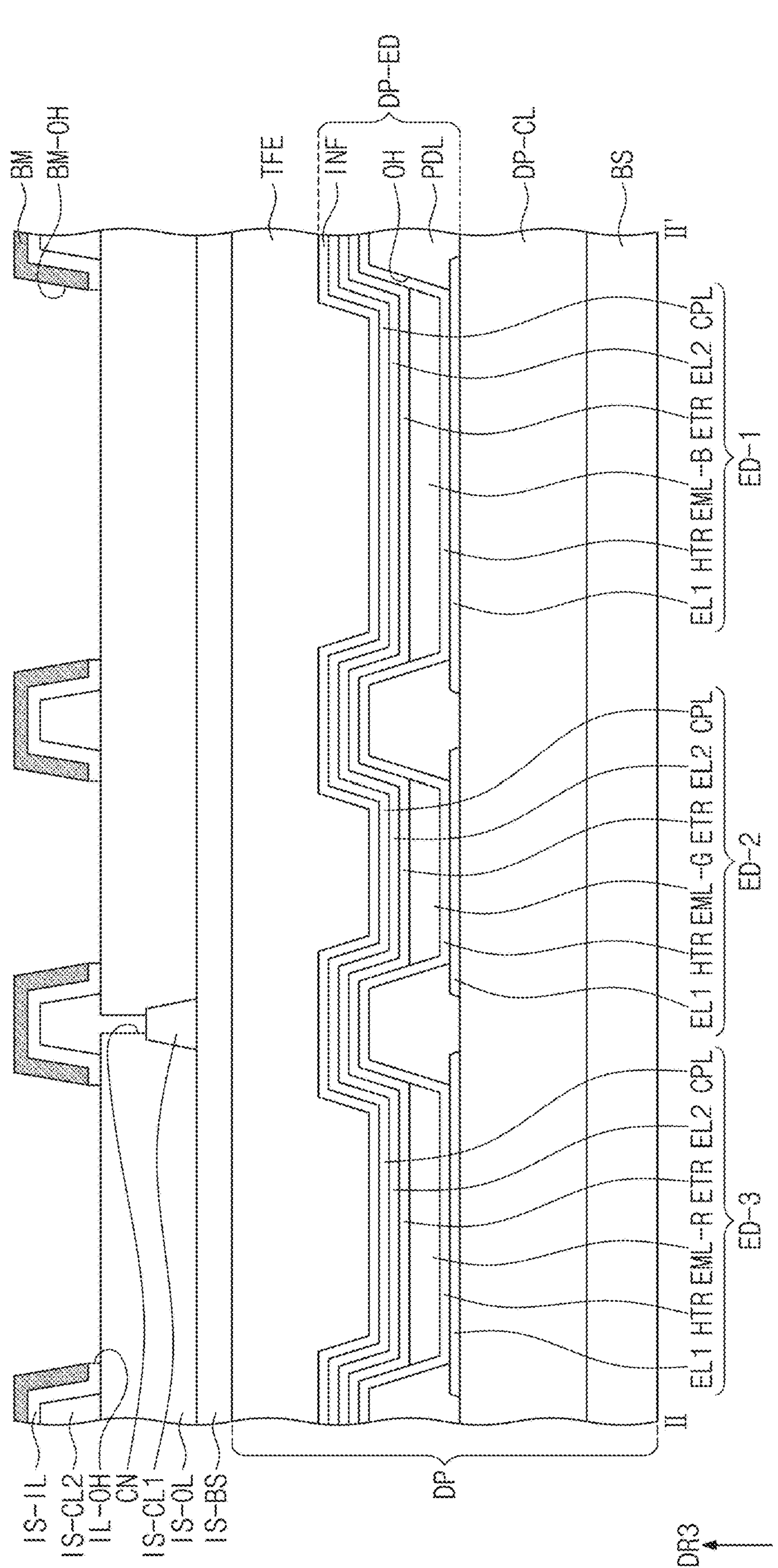
FIG. 28 is a diagram schematically illustrating a process of manufacturing a display device according to an embodiment of the present inventive concept.
Figure 29:
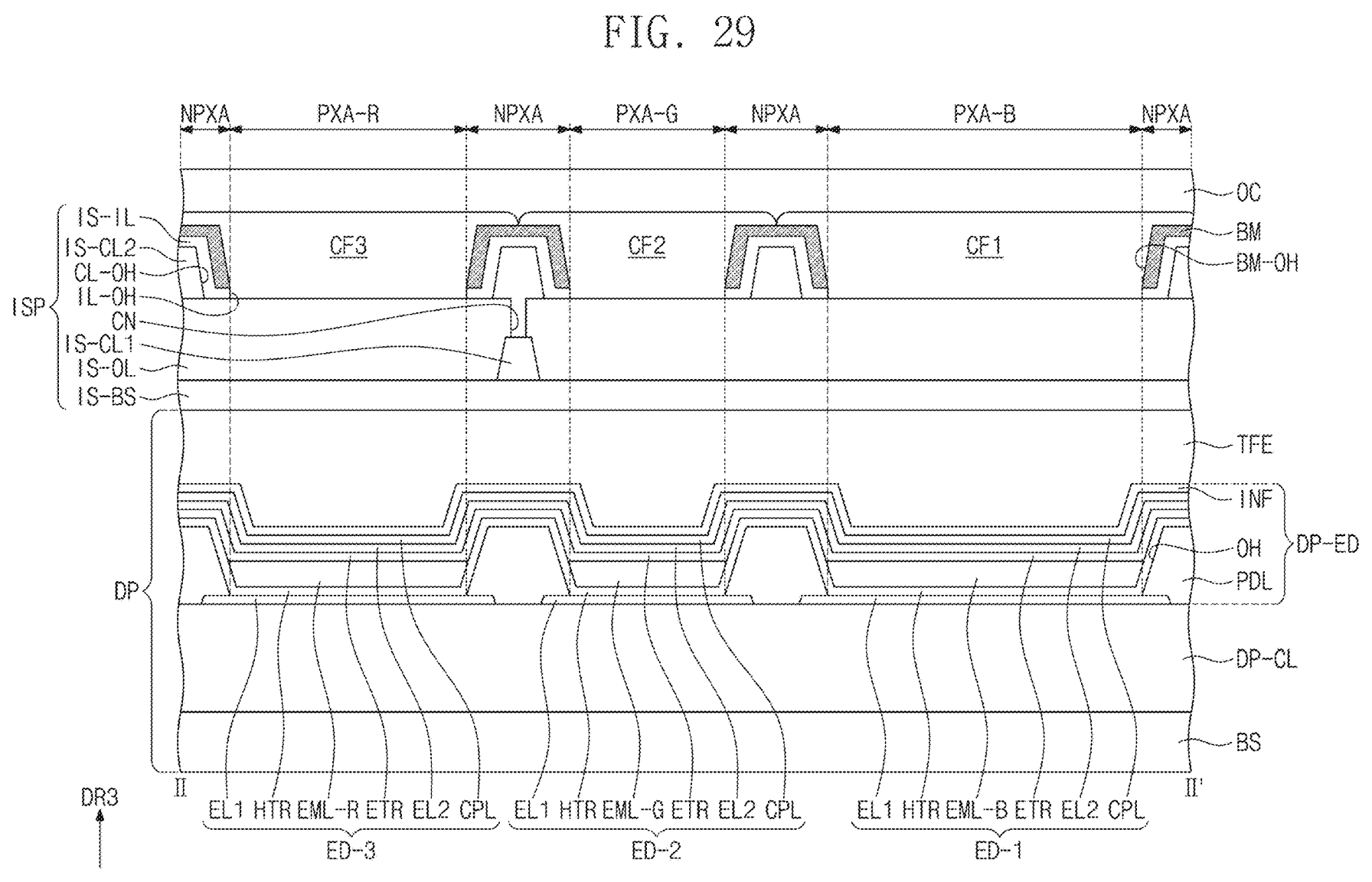

Referring to FIG. 27, a preliminary pattern part P-BM may be formed on the inorganic layer IS-IL. The preliminary pattern part P-BM may be formed conformally to cover the underlying features such as the inorganic layer IS-IL and the organic layer IS-OL. The preliminary pattern part P-BM may be formed of a material that absorbs light. Referring to FIG. 28, the pattern part BM may be formed from the preliminary pattern part P-BM. The pattern opening BM-OH may be formed in the pattern part BM. The pattern opening BM-OH may be formed so as to overlap the light-emitting regions PXA-R, PXA-G, and PXA-B. Also, the pattern opening BM-OH may overlap the opening IL-OH of the inorganic layer IS-IL. Thereafter, a pigment or dye may be provided to the pattern opening BM-OH so as to form the first to third filters CF1 to CF3 illustrated in FIG. 29. Alternatively, a pigment or dye may be provided to the pattern opening BM-OH so as to form the optical control layer CTL illustrated in FIG. 12.

A display device of an embodiment of the present inventive concept may include a display element layer, an input sensing layer arranged on the display element layer, and an optical layer arranged on the input sensing layer. The display element layer may include a light-emitting element and a pixel defining layer. The input sensing layer may include an organic layer, a conductive pattern layer, and an inorganic layer that are sequentially laminated. The optical layer may include a pigment or dye and may reduce reflectance of external light. In an embodiment of the present inventive concept, an opening that overlaps a pixel opening and does not overlap the conductive pattern layer may be defined in the inorganic layer. The opening defined in the inorganic layer may be a passage for discharging gas generated due to outgassing of the organic layer. Accordingly, the display device of an embodiment of the present inventive concept including the inorganic layer in which the opening is defined may exhibit excellent reliability.

Although specific embodiments of the present inventive concept have been described, it is understood that the present inventive concept should not be limited to these embodiments but various changes and modifications can be made by one ordinary skilled in the art, without departing from the spirit and scope of the present inventive concept as defined in the appended claims.

What is claimed is:

1. A display device comprising:

a display element layer including first to third light-emitting elements spaced apart from each other in a direction perpendicular to a thickness direction of the display device and a pixel defining layer in which a pixel opening is defined;

an input sensing layer arranged on the display element layer and including an organic layer, a conductive pattern layer, and an inorganic layer that are sequentially laminated; and an optical layer arranged on the input sensing layer and including first to third filters respectively overlapping the first to third light-emitting elements, wherein an opening that overlaps the pixel opening and does not overlap the conductive pattern layer is defined in the inorganic layer.

2. The display device of claim 1, wherein the inorganic layer covers the conductive pattern layer.

3. The display device of claim 1, wherein a width of the opening defined in the inorganic layer is equal to or smaller than a width of the pixel opening in the direction perpendicular to the thickness direction.

4. The display device of claim 1, wherein at least one of the first to third filters contacts the organic layer through the opening defined in the inorganic layer.

5. The display device of claim 1, wherein the first to third filters each include a pigment or a dye, which fills the opening defined in the inorganic layer.

6. The display device of claim 1, wherein the first to third light-emitting elements each includes a first electrode, a second electrode arranged on the first electrode, and an emission layer arranged between the first electrode and the second electrode, and the opening defined in the inorganic layer overlaps at least one of the emission layer of the first light-emitting element, the emission layer of the second light-emitting element, or the emission layer of the third light-emitting element.

7. The display device of claim 6, wherein the emission layer of the first light-emitting element emits first light, the emission layer of the second light-emitting element emits second light different from the first light, and the emission layer of the third light-emitting element emits third light different from the first light and the second light.

8. The display device of claim 1, wherein the opening defined in the inorganic layer has a quadrilateral shape or a circular shape in a plan view.

9. The display device of claim 1, wherein the optical layer further includes a pattern part in which a pattern opening is defined, and the first to third filters fill the pattern opening.

10. The display device of claim 9, wherein the opening defined in the inorganic layer overlaps the pattern opening.

11. The display device of claim 1, wherein the input sensing layer further includes a signal line connected to the conductive pattern layer and a pad electrode connected to an end of the signal line, and the inorganic layer does not overlap the pad electrode.

12. The display device of claim 1, wherein the conductive pattern layer includes a conductive line overlapping the pixel defining layer, the conductive line includes a first face parallel with a top surface of the organic layer and a second face inclined with respect to the first face in a cross-sectional view, and the inorganic layer covers the first face and the second face of the conductive line.

13. The display device of claim 1, wherein the inorganic layer is divided into a first region overlapping the pixel defining layer and a second region not overlapping the pixel defining layer.

14. The display device of claim 13, wherein the second region extends from the first region, and the opening defined in the inorganic layer is spaced apart from the first region with the second region therebetween.

15. The display device of claim 13, wherein the second region is spaced apart from the first region with the opening defined in the inorganic layer interposed therebetween.

16. A display device comprising:

a display element layer including a light-emitting element and a pixel defining layer in which a pixel opening is defined;

an input sensing layer including an organic layer, a conductive pattern layer, and an inorganic layer that are sequentially laminated on the display element layer; and an optical layer including a pigment or a dye and entirely overlapping the display element layer, wherein an opening that overlaps the pixel opening and does not overlap the conductive pattern layer is defined in the inorganic layer.

17. The display device of claim 16, wherein the pigment or the dye fills the opening defined in the inorganic layer.

18. The display device of claim 16, wherein the optical layer further includes a pattern part in which a pattern opening is defined, with the pattern part overlapping the pixel defining layer, and the pigment or the dye fills the pattern opening.

19. The display device of claim 18, wherein the opening defined in the inorganic layer overlaps the pattern opening.

20. The display device of claim 16, wherein the light-emitting element includes a first electrode exposed in the pixel opening, a second electrode arranged on the first electrode, and an emission layer arranged between the first electrode and the second electrode, and the opening defined in the inorganic layer overlaps the emission layer.

21. An electronic device including a display module and a power supply unit that supplies power to the display module, the display module comprising:

a display element layer including first to third light-emitting elements spaced apart from each other in a direction perpendicular to a thickness direction of the display module and a pixel defining layer in which a pixel opening is defined;

an input sensing layer arranged on the display element layer and including an organic layer, a conductive pattern layer, and an inorganic layer that are sequentially laminated; and an optical layer arranged on the input sensing layer and including first to third filters respectively overlapping the first to third light-emitting elements, wherein an opening that overlaps the pixel opening and does not overlap the conductive pattern layer is defined in the inorganic layer.

* * * * *